(12) United States Patent
Lue

(10) Patent No.: US 9,831,257 B2
(45) Date of Patent: Nov. 28, 2017

(54) SGVC 3D ARCHITECTURE WITH FLOATING GATE DEVICE IN LATERAL RECESSES ON SIDES OF CONDUCTIVE STRIPS AND INSULATING STRIPS

(71) Applicant: MACRONIX INTERNATIONAL CO., LTD., Hsinchu (TW)

(72) Inventor: Hang-Ting Lue, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/017,487

(22) Filed: Feb. 5, 2016

(65) Prior Publication Data

US 2017/0194340 A1 Jul. 6, 2017

(30) Foreign Application Priority Data

Dec. 30, 2015 (TW) .............................. 104144348 A

(51) Int. Cl.
*H01L 27/11* (2006.01)
*H01L 29/78* (2006.01)
*H01L 21/28* (2006.01)
*H01L 29/66* (2006.01)
*H01L 27/11556* (2017.01)
(Continued)

(52) U.S. Cl.
CPC ...... *H01L 27/11556* (2013.01); *H01L 23/528* (2013.01); *H01L 27/11521* (2013.01)

(58) Field of Classification Search
CPC ............. H01L 27/115; H01L 27/11521; H01L 29/7883; H01L 21/28273; H01L 29/42324; H01L 27/11517; H01L 29/66825

USPC .......................... 257/321; 438/263, 264, 594
See application file for complete search history.

(56) References Cited

U.S. PATENT DOCUMENTS

| | | |
|---|---|---|
| 6,906,940 B1 | 6/2005 | Lue |
| 7,153,780 B2 | 12/2006 | Hill et al. |
| 7,315,474 B2 | 1/2008 | Lue |

(Continued)

FOREIGN PATENT DOCUMENTS

EP 2048709 A2 4/2009

OTHER PUBLICATIONS

Wang, Michael, "Technology Trends on 3D-NAND Flash Storage", Impact 2011, Taipei, dated Oct. 20, 2011, found at 222.impact.org.tw/2011/files/newsfile/201111110190.pdf.

(Continued)

*Primary Examiner* — Trung Q Dang
*Assistant Examiner* — Didarul Mazumder
(74) *Attorney, Agent, or Firm* — Yiding Wu; Haynes Beffel & Wolfeld LLP

(57) ABSTRACT

A memory device is provided that includes a plurality of memory cells. The memory device includes a plurality of stacks of conductive strips separated by insulating strips. Data storage structures including floating gates are disposed along the conductive strips in the stacks. Vertical channel films are disposed on sidewalls of the stacks. Memory cells in the plurality of memory cells have channels in the vertical channel films, and control gates in the conductive strips. A tunnel oxide layer is disposed between the vertical channel films and the floating gates. The floating gates can be coplanar with conductive strips in the plurality of stacks, or be disposed between the conductive strips in the plurality of stacks.

10 Claims, 36 Drawing Sheets

(51) Int. Cl.
    *H01L 27/11521* (2017.01)
    *H01L 23/528* (2006.01)

(56) References Cited

U.S. PATENT DOCUMENTS

| | | |
|---|---|---|
| 7,420,242 B2 | 9/2008 | Lung |
| 7,696,559 B2 | 4/2010 | Arai et al. |
| 7,851,849 B2 | 12/2010 | Kiyotoshi |
| 8,008,732 B2 | 8/2011 | Kiyotoshi et al. |
| 8,363,476 B2 | 1/2013 | Lue et al. |
| 8,467,219 B2 | 6/2013 | Lue |
| 8,503,213 B2 | 8/2013 | Chen et al. |
| 8,648,438 B2 | 2/2014 | Cai et al. |
| 8,759,899 B1 | 6/2014 | Lue et al. |
| 8,853,818 B2 | 10/2014 | Lue |
| 9,147,468 B1 | 9/2015 | Lue |
| 9,287,291 B2 | 3/2016 | Lue |
| 2005/0280061 A1 | 12/2005 | Lee |
| 2007/0045708 A1 | 3/2007 | Lung |
| 2007/0158736 A1 | 7/2007 | Arai et al. |
| 2007/0252201 A1 | 11/2007 | Kito et al. |
| 2008/0073635 A1 | 3/2008 | Kiyotoshi et al. |
| 2008/0175032 A1 | 7/2008 | Tanaka et al. |
| 2008/0180994 A1 | 7/2008 | Katsumata et al. |
| 2009/0097321 A1 | 4/2009 | Kim et al. |
| 2009/0184360 A1 | 7/2009 | Jin et al. |
| 2010/0181612 A1* | 7/2010 | Kito .......... H01L 27/11551 257/319 |
| 2010/0270593 A1 | 10/2010 | Lung et al. |
| 2011/0018051 A1 | 1/2011 | Kim et al. |
| 2012/0001249 A1* | 1/2012 | Alsmeier ...... H01L 27/11551 257/319 |
| 2012/0068241 A1 | 3/2012 | Sakuma et al. |
| 2012/0119283 A1 | 5/2012 | Lee et al. |
| 2012/0147644 A1 | 6/2012 | Scheuerlein |
| 2012/0182806 A1 | 7/2012 | Chen et al. |
| 2013/0049095 A1* | 2/2013 | Whang ......... H01L 27/11556 257/321 |
| 2013/0100741 A1* | 4/2013 | Choi ........... H01L 27/11565 365/185.18 |
| 2013/0134492 A1 | 5/2013 | Yang et al. |
| 2013/0207178 A1 | 8/2013 | Lee et al. |
| 2013/0248945 A1 | 9/2013 | Bracale et al. |
| 2014/0231954 A1 | 8/2014 | Lue |
| 2015/0263016 A1 | 9/2015 | Cha |
| 2015/0318301 A1 | 11/2015 | Lee et al. |
| 2015/0364487 A1 | 12/2015 | Yun |
| 2016/0043100 A1 | 2/2016 | Lee et al. |
| 2016/0181271 A1* | 6/2016 | Yada .......... H01L 27/11582 438/264 |

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012. 91-92.
Sung-Jin Choi et al., "Performance Breakthrough in NOR Flash Memory with Dopant-Segregated Schottky-Barrier (DSSB) SONOS Devices," 2009 Symposium on VLSI Technology Digest of Technical Papers, pp. 222-223.
Yoshiaki Fukuzumi et al., "Optimal Integration and Characteristics of Vertical Array Devices for Ultra-High Density, Bit-Cost Scalable Flash Memory," IEEEE Dec. 2007, pp. 449-452.
Tzu-Hsuan Hsu et al., "Study of sub-30nm thin film transistor (TFT) charge-trapping (CT) devices for 3D NAND flash application" Electron Devices Meeting (IEDM), 2009 IEEE International, Dec. 7-9, 2009, pp. 1-4.
A. Hubert et al., "A Stacked SONOS Technology, Up to 4 Levels and 6nm Crystalline Nanowires, With Gate-All-Arouns or Independent Gates (o-Flash), Suitable for Full 3D Integration," IEEE IEDM Dec. 7-9, 2009, pp. 27.6.1-27.6.4.
Chun-Hsiung Hung et al., "A highly scalable vertical gate (VG) 3D NAND Flash with robust program disturb immunity using a novel PN diode decoding structure," VLSI Technology (VLSIT), 2011 Symposium on , vol., No., pp. 68,69, Jun. 14-16, 2011.
Jang, Jaehoon, et al., "Vertical cell array using TCAT(Terabit Cell Array Transistor) technology for ultra high density NAND flash memory," 2009 Symp. on VLSI Technology, Jun. 16-18, 2009, 2 pages.
Soon-Moon Jung et al., "Three Dimensionally Stacked NAND Flash Memory Technology Using Stacking Single Crystal Si Layers on ILD and TANOS Structure for Beyond 30nm Node," Electron Devices Meeting, 2006, IDEM '06 International Dec. 11-13, 2006, pp. 1-4.
Ryota Katsumata et al., "Pipe-shaped BiCS flash memory with 16 stacked layers and multi-level-cell operation for ultra high density storage devices," VLSI Technology, 2009 Symposium on Jun. 16-18, 2009, pp. 136-137.
Jiyoung Kim et al., "Novel 3-D Structure for Ultra High Density Flash Memory with VRAT (Vertical-Recess-Array-Transistor) and PIPE (Planarized Integration on the same PlanE)," 2008 IEEE Symposium on VLSI Technology Digest of Technical Papers, pp. 122-123.
Jiyoung Kim et al., "Novel Vertical-Stacked-Array-Transistor (VSAT) for Ultra-High-Density and Cost-Effective NAND Flash Memory Devices and SSD (Solid State Drive)," 2009 Symposium on VLSI Technology Digest of Technical Papers, pp. 186-187.
Yoon Kim et al., "Three-Dimensional NAND Flash Architecture Design Based on Single-Crystalline Stacked Array," IEEE Transactions on Electron Devices, vol. 59, No. 1, Jan. 2012, pp. 35-45.
Wonjoo Kim et al., "Multi-Layered Vertical Gate NAND Flash Overcoming Stacking Limit for Terabit Density Storage," 2009 Symposium on VLSI Technology Digest of Technical Papers, pp. 188-189.
Erh-Kun Lai et al., "A Multi-Layer Stackable Thin-Film Transistor (TFT) NAND-Type Flash Memory," International Electron Devices Meeting, 2006. IEDM '06, Dec. 11-13, 2006, pp. 1-4.
Hang-Ting Lue et al., "A Highly Scalable 8-Layer 3D Vertical-Gate (VG) TFT NAND Flash Using Junction-Free Buried channel BE-SONOS Device," 2010 IEEE Symposium on VLSI Technology Digest of Technical Papers, pp. 131-132.
Etienne Nowak et al., "Intrinsic Fluctuations in Vertical NAND Flash Memories," 2012 IEEE Symposium on VLSI Technology Digest of Technical Papers, pp. 21-22.
H. Tanaka et a., "Bit Cost Scalable Technology with Punch and Plug Process for Ultra High Density Flash Memory," 2007 Symposium on VLSI Technology Digest of Technical Papers, pp. 14-15.
U.S. Appl. No. 14/309,622, entitled "Bandgap-engineered Memory with Multiple Charge Trapping Layers Storing Charge," by Hang-Ting Lue, filed Jun. 19, 2014, 108 pages.
U.S. Appl. No. 14/471,788, entitled "Multiple-Bit-Per-Cell," Independent Double Gate, Vertical Channel Memory, by Hang-Ting Lue, filed Aug. 28, 2014, 79 pages.
U.S. Appl. No. 14/637,204, entitled "U-Shaped Vertical Thin-Channel Memory," by Hang-Ting Lue, filed Mar. 2015, 78 pages.
U.S. Appl. No. 14/637,187—Office Action dated May 19, 2016, 21 pages.
U.S. Appl. No. 14/637,187, entitled "Vertical Thin-Channel Memory," by Hang-Ting Lue, filed Mar. 3, 2015, 90 pages.

\* cited by examiner

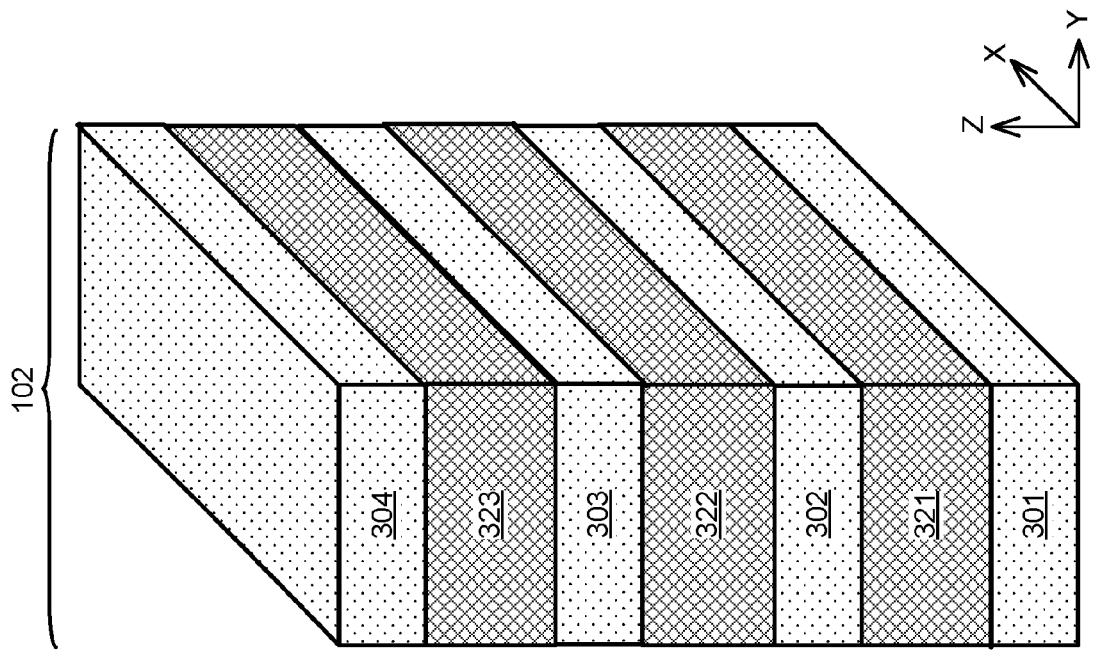
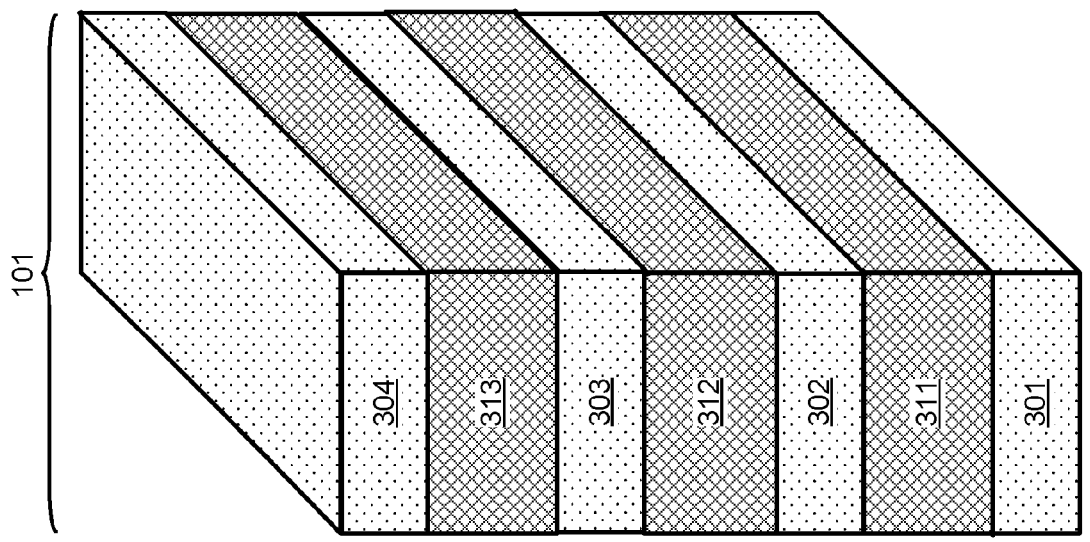
FIG. 3

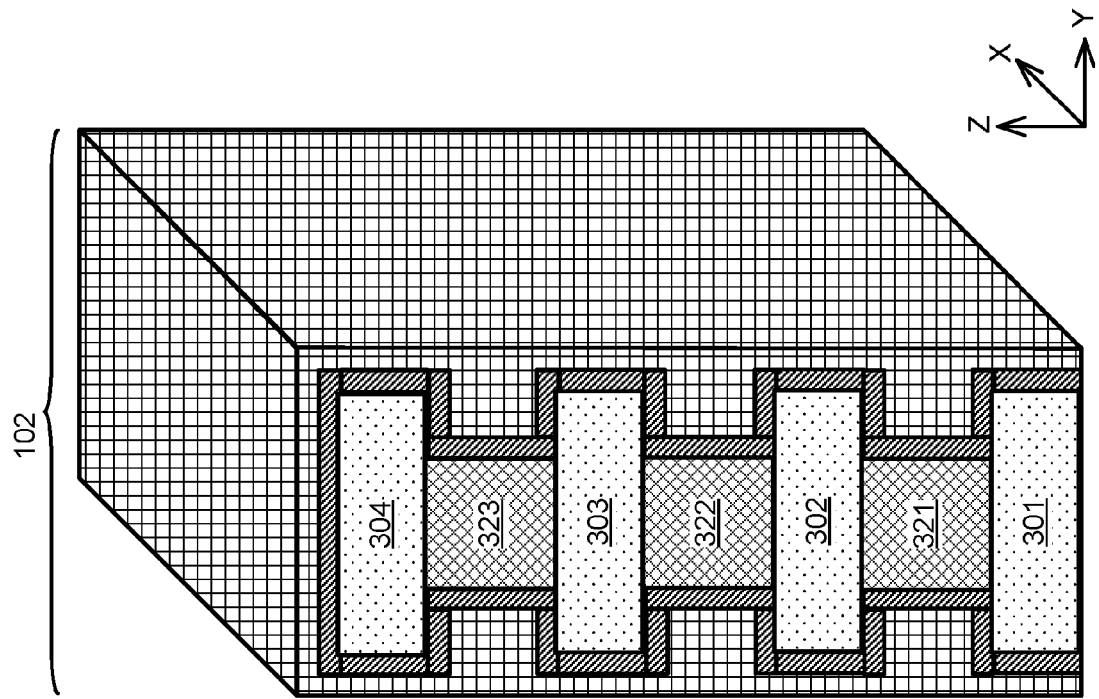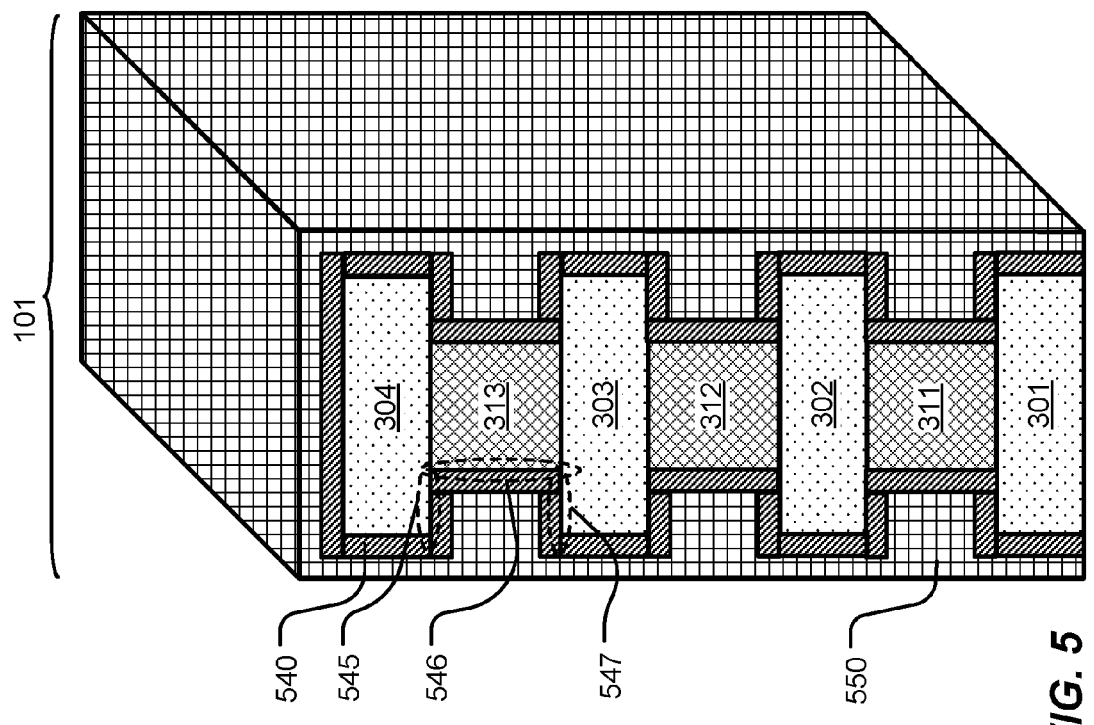
FIG. 5

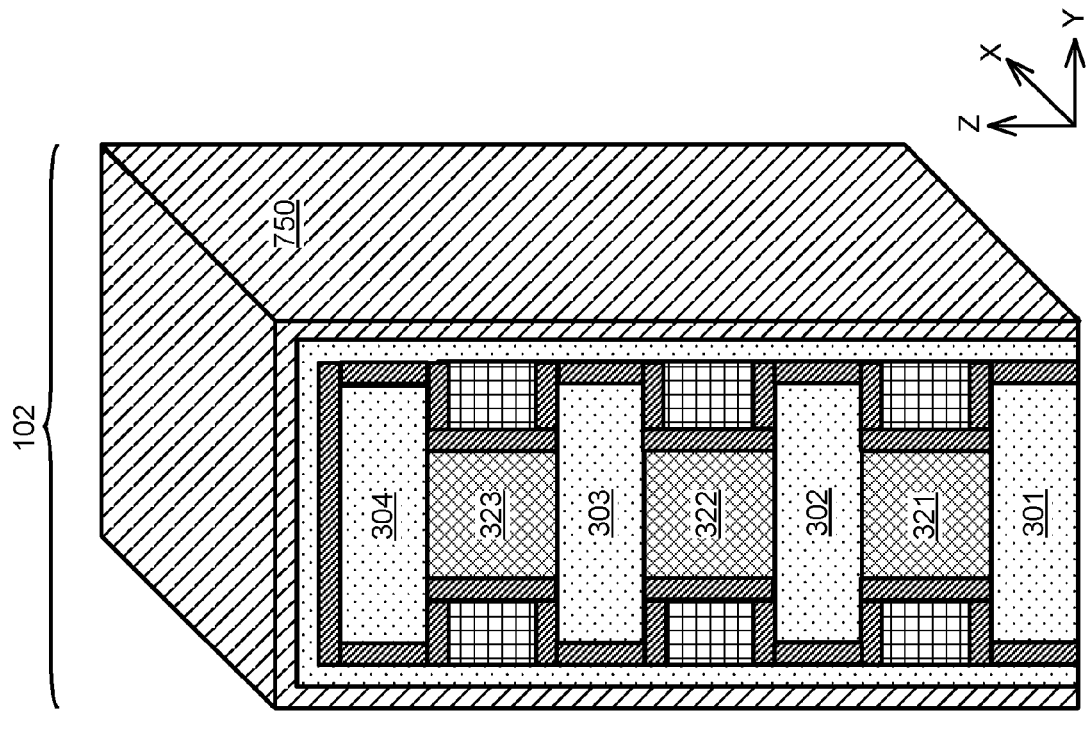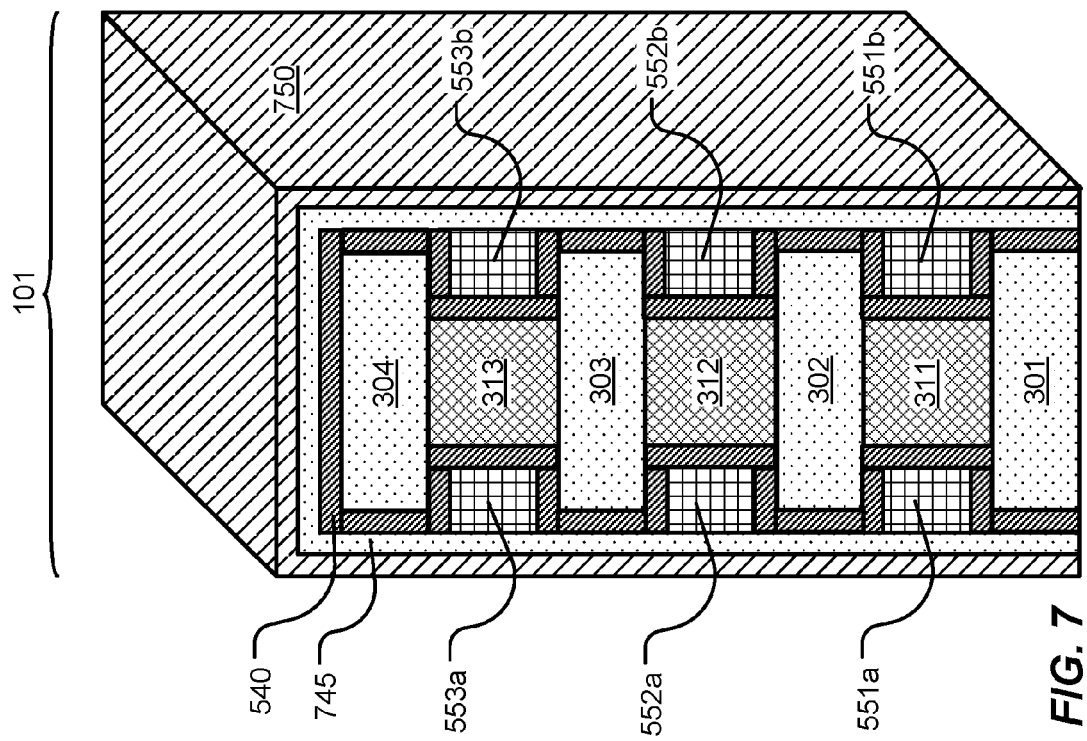
FIG. 7

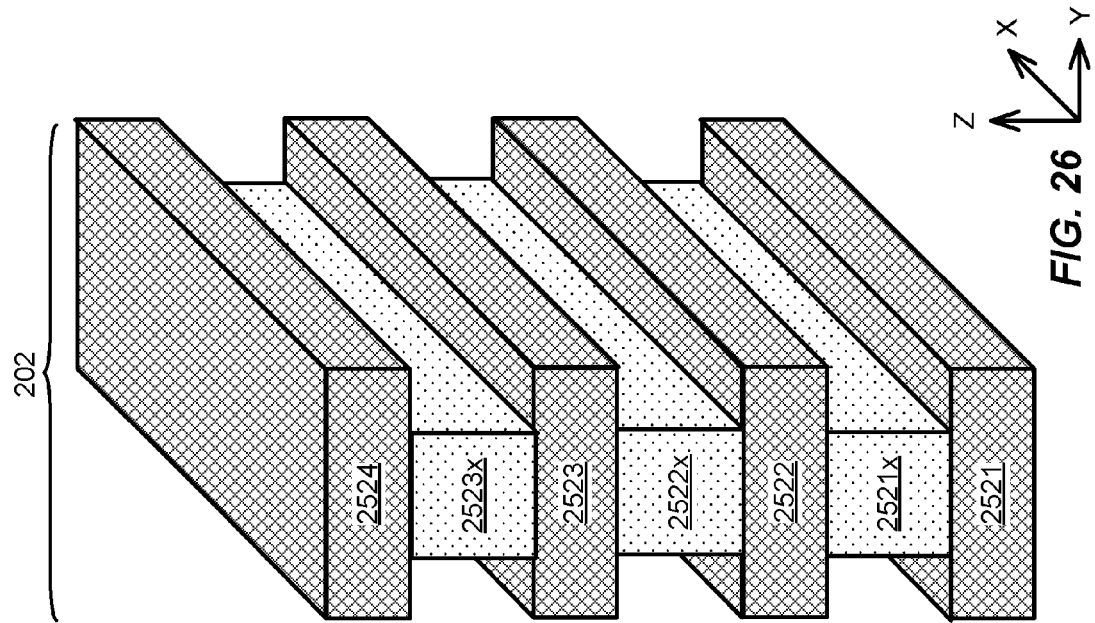
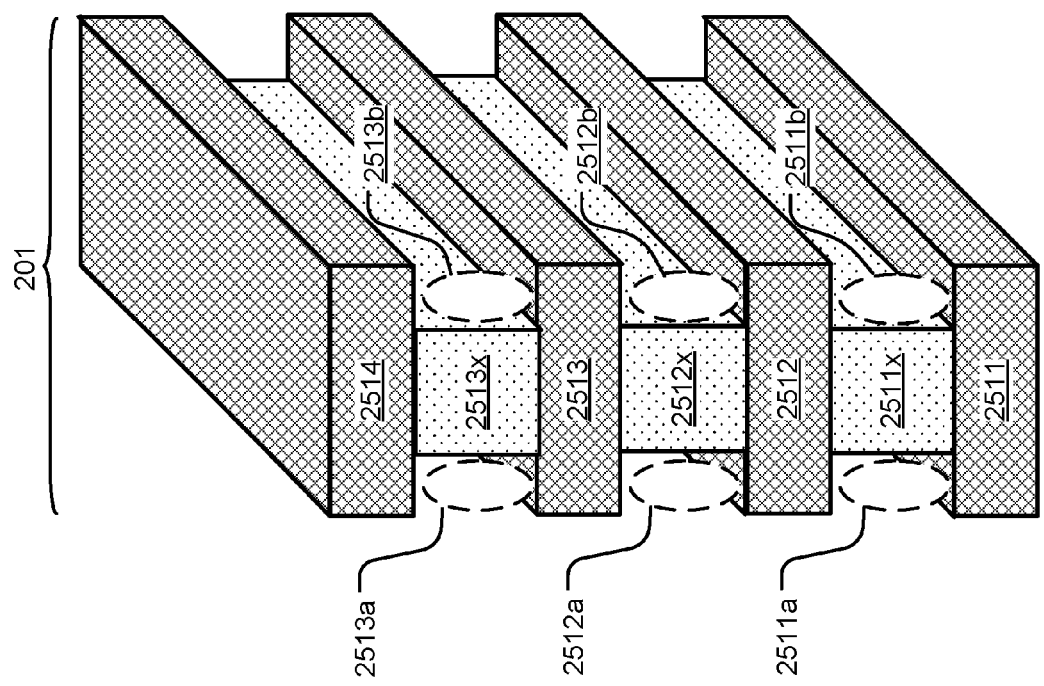
FIG. 26

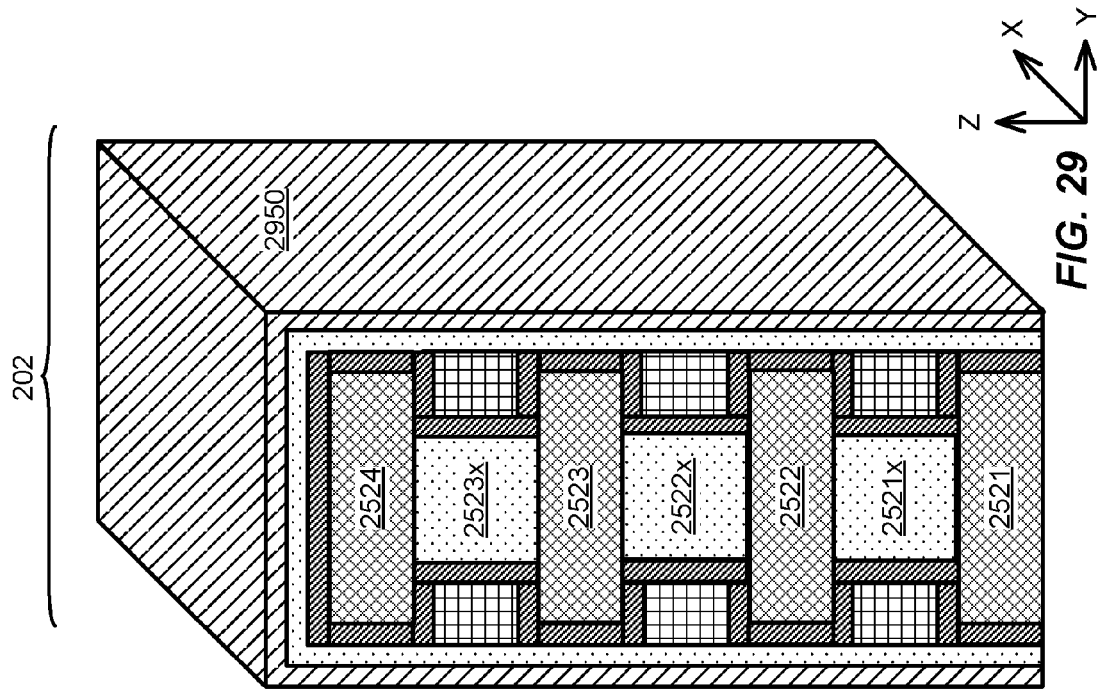
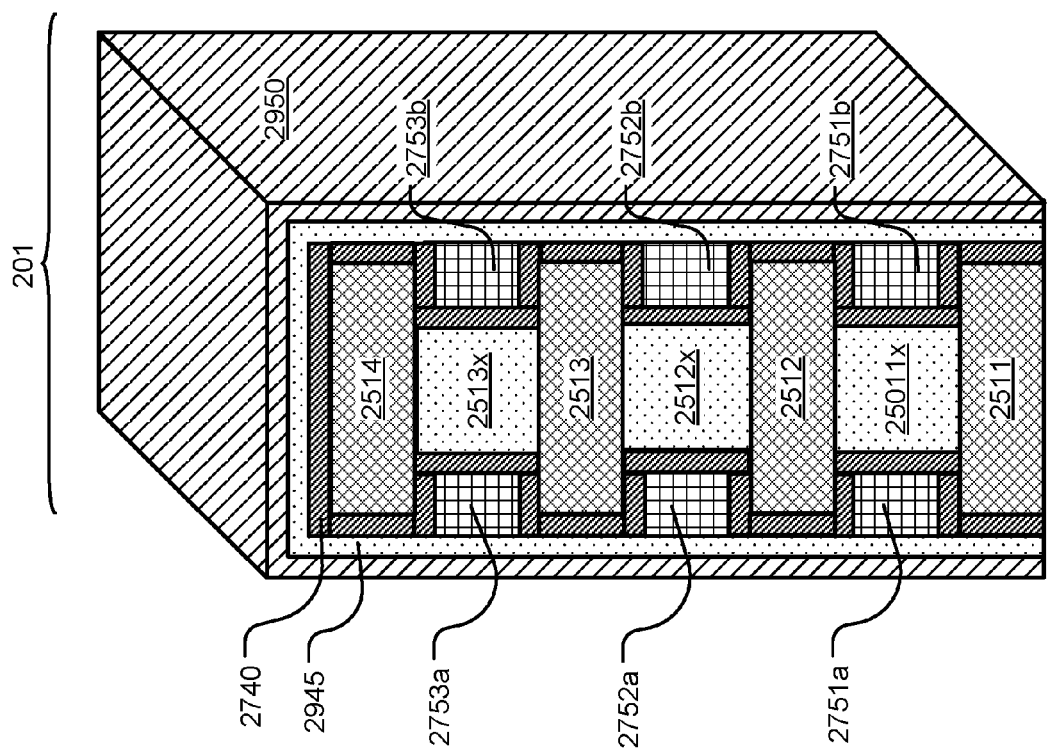
FIG. 29

SGVC 3D ARCHITECTURE WITH FLOATING GATE DEVICE IN LATERAL RECESSES ON SIDES OF CONDUCTIVE STRIPS AND INSULATING STRIPS

PRIORITY APPLICATION

This application claims priority to Taiwan Patent Application No. 104144348, filed 30 Dec. 2015, which application is incorporated by reference as if fully set forth herein.

RELATED APPLICATIONS

This application is related to co-pending U.S. patent application Ser. No. 14/637,204, filed 3 Mar. 2015, entitled U-SHAPED VERTICAL THIN-CHANNEL MEMORY, which application is incorporated by reference as if fully set forth herein.

BACKGROUND

Field of the Technology

The present invention relates to high density memory devices, and particularly to memory devices in which multiple planes of memory cells are arranged to provide a three-dimensional 3D array.

Description of Related Art

High density memory devices are being designed that comprise arrays of flash memory cells, or other types of memory cells. In some examples, the memory cells comprise thin film transistors which can be arranged in 3D architectures.

In one example, a 3D memory device includes a plurality of stacks of NAND strings of memory cells. The stacks include active strips separated by insulating material. The 3D memory device includes an array including a plurality of word lines structures, a plurality of string select structures, and ground select lines, arranged orthogonally over the plurality of stacks. Memory cells are formed at cross-points between the active strips in the plurality of stacks and the word lines structures.

One type of memory cells is referred to as a charge trapping memory cell, which uses a dielectric charge trapping layer. A typical charge trapping memory cell consists of a field effect transistor FET structure having a source and drain separated by a channel, and a gate separated from the channel by a charge storage structure including a tunnel dielectric layer, the dielectric charge trapping layer, and a blocking dielectric layer. According to the early conventional charge trapping memory designs referred to as SONOS (silicon-oxide-nitride-oxide-silicon) devices, the source, drain and channel are formed in a silicon body, the tunnel dielectric layer is formed of silicon oxide, the dielectric charge trapping layer is formed of silicon nitride, the blocking dielectric layer is formed of silicon oxide, and the gate includes polysilicon.

Another type of memory cells is referred to as a floating gate memory cell. A floating gate memory cell has a double gate MOSFET (metal-oxide-semiconductor field-effect transistor) structure including a control gate and a floating gate. A floating gate memory cell can be programmed to represent a logic level by trapping electrons on the floating gate and thus modifying the threshold voltage of the floating gate memory cell. The threshold voltage is the voltage applied to the control gate at which the double gate MOSFET becomes conductive.

The manufacturing process for a floating gate memory device can be more complicated than a charge trapping memory device, especially for three-dimensional arrays of floating gate memory cells. For instance, formation of floating gates in a floating gate memory device can require additional masks, such as when a SAMOS (Self-Aligned MOS) process is used as described in U.S. Pat. No. 7,153,780. Silicon nitride based charge-trapping device are relatively less complicated for process integration and manufacturing. Because silicon nitride is naturally an insulating film, there is no need to pattern silicon nitride with additional masks. In 3D NAND architectures, this could be an important advantage to minimize the processing integration complexity.

It is desirable to provide a floating gate structure for three-dimensional integrated circuit memory that reduces the complexity in manufacturing.

SUMMARY

A memory device is provided that includes a plurality of memory cells. The memory device includes a plurality of stacks of conductive strips separated by insulating strips. Data storage structures including floating gates are disposed along the conductive strips in the stacks. Vertical channel films are disposed on sidewalls of the stacks. Memory cells in the plurality of memory cells have channels in the vertical channel films, and control gates in the conductive strips. A tunnel oxide layer is disposed between the vertical channel films and the floating gates, and a layer of inter-gate dielectric material is disposed between the conductive strips and the floating gates, and between the insulating strips and the floating gates. The floating gates can be coplanar with conductive strips in the plurality of stacks, or be disposed between the conductive strips in the plurality of stacks. The floating gates can have thicknesses less than 20 nanometers. The floating gates include a conductive material. A particular floating gate in a stack of conductive strips is isolated from floating gates in the stack vertically adjacent to the particular floating gate.

Memory cells in the plurality of memory cells having control gates in a particular conductive strip in the conductive strips have floating gates on a first side of the particular conductive strip, and adjacent memory cells in the plurality of memory cells having control gates in the particular conductive strip have floating gates on a second side of the particular conductive strip opposite the first side.

In one embodiment, the vertical channel films are connected to a substrate below the plurality of stacks, and a pair of vertical channel films in the vertical channel films on two adjacent stacks in the plurality of stacks are connected via a pad between the two adjacent stacks at ends distal to the substrate. The memory device includes one or more patterned conductor layers over the plurality of stacks, including a bit line, and interlayer connectors connecting the bit line to the pad.

In another embodiment, the vertical channel films include first and second vertical channel films on first and second stacks in a pair of adjacent stacks in the plurality of stacks, the first vertical channel film includes a first pad over the first stack on an upper end of the first vertical channel film, the second vertical channel film includes a second pad over the second stack on an upper end of the second vertical channel film, the first and second vertical channel films are connected at ends distal to the pads to form a current path from the first pad over the first stack to the second pad over the second stack. The memory device includes one or more patterned conductor layers over the plurality of stacks, including a bit line and a source line, and interlayer connectors connecting the bit line to the first pad over the first stack and connecting the source line to the second pad over the second stack.

The memory device can include a solid dielectric material between the vertical channel films on two adjacent stacks in the plurality of stacks. The memory device can include a gap between the vertical channel films on two adjacent stacks in the plurality of stacks.

Methods for manufacturing memory devices as described herein are also provided, including a self-aligned process in formation of floating gates without the need for an etch mask.

Advantages of floating gate technology, such as the technology described herein, includes a nearly ideal ISPP (incremental stepped pulse programming) slope of close to 1, while silicon nitride based charge-trapping device often has ISPP slope less than 0.8. A floating gate NAND device is relatively easy for erase and has low erase saturation threshold voltage less than −5V. Thus in principle, a floating gate NAND device has a larger program/erase memory window than silicon nitride based charge-trapping device.

Other aspects and advantages of the present technology can be seen on review of the drawings, the detailed description and the claims, which follow.

BRIEF DESCRIPTION OF THE DRAWINGS

FIGS. 3 through 9, 10A and 10B illustrate an example process flow for a SVGC (single gate vertical channel) 3D NAND memory device with floating gate memory cells.

FIGS. 25 through 31 illustrate an example process flow for an alternative embodiment of a SVGC (single gate vertical channel) 3D NAND memory device with floating gate memory cells.

DETAILED DESCRIPTION

Figure 1:
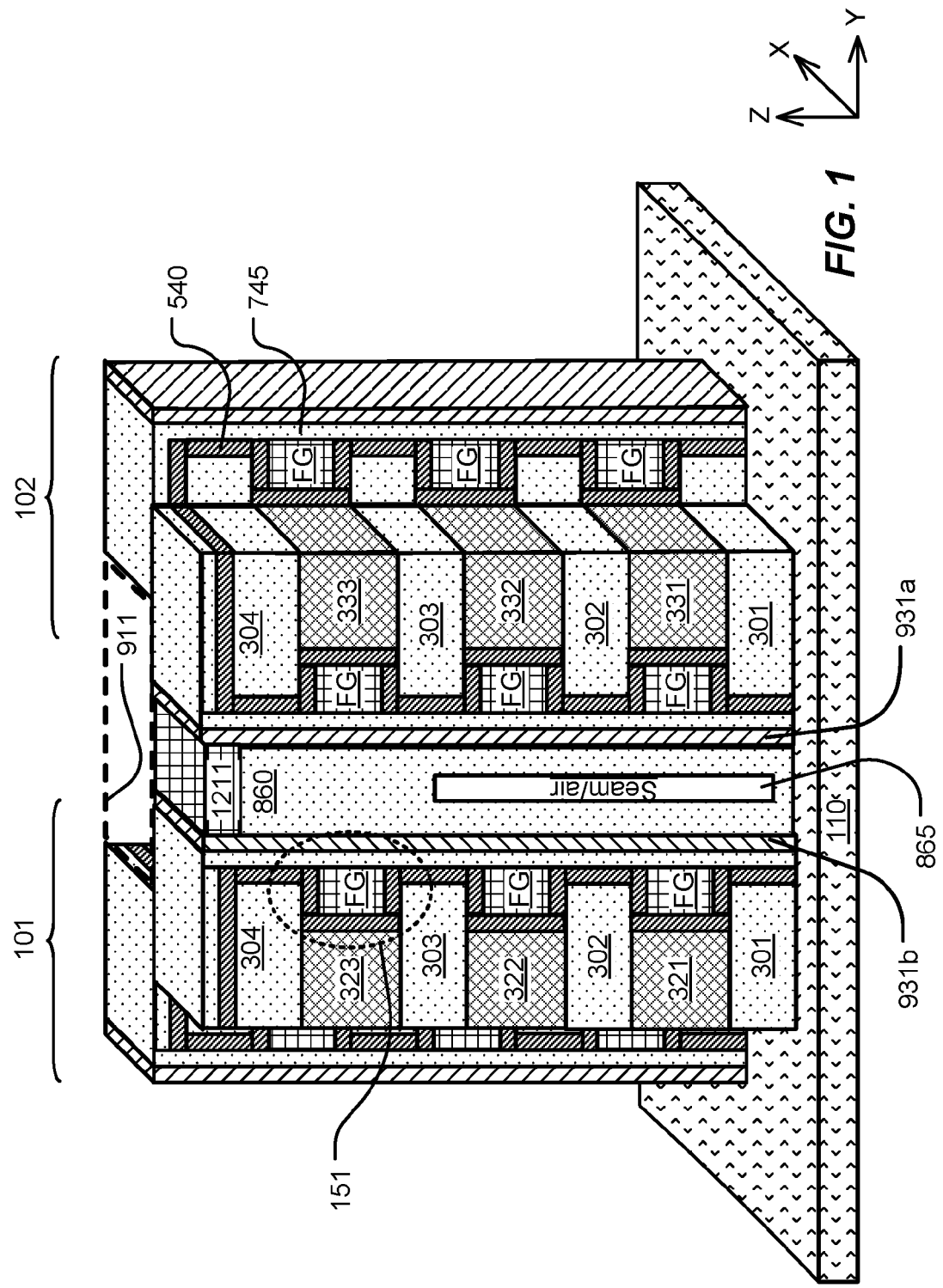
FIG. 1 is a simplified perspective diagram of an embodiment of a 3D NAND memory device as described herein.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified perspective diagram of an embodiment of a 3D NAND memory device as described herein. The memory device includes a plurality of stacks (e.g. 101, 102) of conductive strips (e.g. 321, 322, 323, 331, 332, 333) separated by insulating strips (e.g. 301, 302, 303, 304). Data storage structures including floating gates (e.g. FG) are disposed along the conductive strips in the stacks, in the X-direction. The floating gates (e.g. FG) are coplanar with conductive strips in the plurality of stacks in lateral recesses on sides of the conductive strips in this example. A layer of inter-gate dielectric material (e.g. 540) is disposed between the conductive strips and the floating gates, and between the insulating strips and the floating gates, in the lateral recesses. For instance, the lateral recesses on sides of the conductive strips can be 30 nm to 50 nm to accommodate the inter-gate dielectric material and the floating gates. The lateral recesses are further described in connection with FIGS. 4-6. Vertical channel films (e.g. 931a, 931b) are disposed on sidewalls of the stacks. A tunnel oxide layer (e.g. 745) is disposed between the vertical channel films and the floating gates. Memory cells (e.g. 151) in the plurality of memory cells have channels in the vertical channel films, and control gates in the conductive strips.

The floating gates in the data storage structures can include a conductive material such as a thin poly silicon material or a metal material. The metal material can improve the programming saturation. For example, a high work function metal such as TiN, or very high work function metals such as Ru, Ir, IrO2 or even Pt, can be used if processing allows such metals. In contrast, the dielectric charge trapping layer in a charge trapping memory cell includes non-conductive materials, such as silicon nitride. For instance, silicon nitride is often used as an insulator and chemical barrier in manufacturing integrated circuits, to electrically isolate different structures or as an etch mask. The inter-gate dielectric material can include a typical ONO (oxide-nitride-oxide) inter-poly dielectric, or it can combine high-K materials such as HfO2 or Al2O3 with metal doping such as Ru, La, Ir, etc to stabilize the high-K materials.

The vertical channel films can be connected to a substrate (e.g. 110) below the plurality of stacks, and a pair of vertical channel films in the vertical channel films (e.g. 931a, 931b) on two adjacent stacks in the plurality of stacks (e.g. 101, 102) can be connected via a pad (e.g. 1211) between the two adjacent stacks at ends distal to the substrate. The vertical channel films can be a thin polysilicon film, or semiconductor materials such as SiGe, SiC, etc.

The memory device can include one or more patterned conductor layers over the plurality of stacks, including a bit line, and interlayer connectors connecting the bit line to the pad, as further described in connection with FIG. 21.

The memory device can include a solid dielectric material (e.g. 860) between the vertical channel films on two adjacent stacks in the plurality of stacks. The memory device can include a gap (865) between the vertical channel films on two adjacent stacks in the plurality of stacks.

Figure 2:
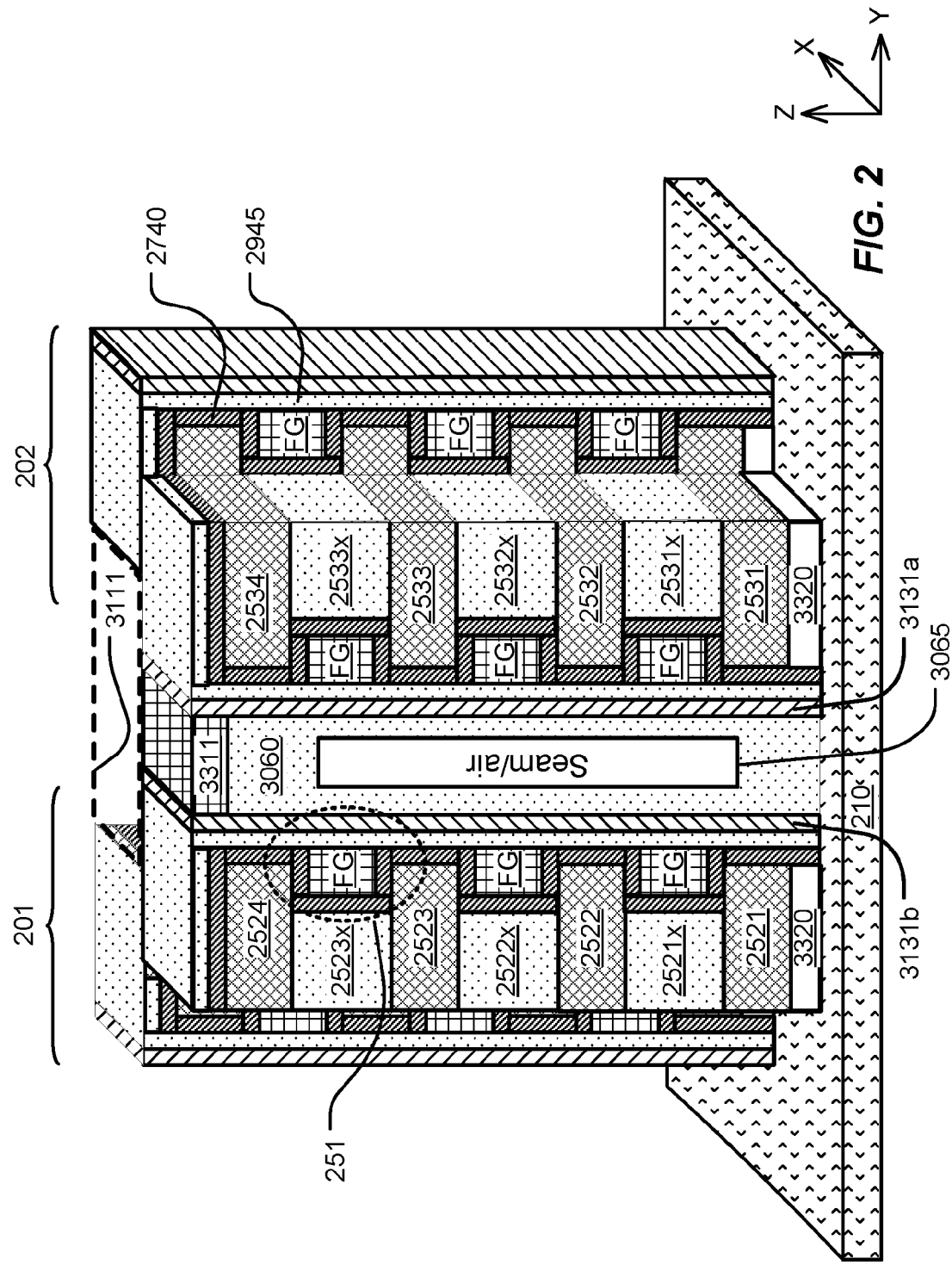
FIG. 2 is a simplified perspective diagram of an alternative embodiment of a 3D NAND memory device as described herein.

FIG. 2 is a simplified perspective diagram of an alternative embodiment of a 3D NAND memory device as described herein. The memory device includes a plurality of stacks (e.g. 201, 202) of conductive strips (e.g. 2521, 2522, 2523, 2524, 2531, 2532, 2533, 2534) separated by insulating strips (e.g. 2521x, 2522x, 2523x, 2531x, 2532x, 2533x). Data storage structures including floating gates (e.g. FG) are disposed along the conductive strips in the stacks, in the X-direction. The floating gates (e.g. FG) are disposed between the conductive strips in the plurality of stacks in lateral recesses on sides of the insulating strips in this example. A layer of inter-gate dielectric material (e.g. 2740) is disposed between the conductive strips and the floating gates, and between the insulating strips and the floating gates, in the lateral recesses. For instance, the lateral recesses on sides of the insulating strips can be 30 nm to 50 nm to accommodate the inter-gate dielectric material and the floating gates. The lateral recesses are further described in connection with FIGS. 26-28. Vertical channel films (e.g. 3131a, 3131b) are disposed on sidewalls of the stacks. A tunnel oxide layer (e.g. 2945) is disposed between the vertical channel films and the floating gates. Memory cells (e.g. 251) in the plurality of memory cells have channels in the vertical channel films, and control gates in the conductive strips. The inter-gate dielectric material and materials of the floating gates are as described in connection with FIG. 1.

The vertical channel films can be connected to a substrate (e.g. 210) below the plurality of stacks, and a pair of vertical channel films in the vertical channel films (e.g. 3131a, 3131b) on two adjacent stacks in the plurality of stacks (e.g. 201, 202) can be connected via a pad (e.g. 3311) between the two adjacent stacks at ends distal to the substrate. The memory device can include one or more patterned conductor layers over the plurality of stacks, including a bit line, and interlayer connectors connecting the bit line to the pad, as further described in connection with FIG. 21.

The memory device can include a solid dielectric material (e.g. 3060) between the vertical channel films on two adjacent stacks in the plurality of stacks. The memory device can include a gap (3065) between the vertical channel films on two adjacent stacks in the plurality of stacks. A layer of nitride material (e.g. 3320) is disposed between a bottom layer of conductive strips in the stacks of conductive strips and the substrate 210.

FIGS. 3 through 9, 10A and 10B illustrate an example process flow for a SVGC (single gate vertical channel) 3D NAND memory device with floating gate memory cells.

FIG. 3 illustrates a stage of the process flow after forming a plurality of stacks of conductive strips separated by insulating strips on a semiconductor substrate (not shown).

To form the structure shown in FIG. 3, a plurality of layers of a first conductive material, such as doped polysilicon, or other material suitable for use as word lines, separated by layers of insulating material, are disposed over the substrate. In embodiments described herein, the conductive material can be a heavily p-type doped polysilicon (P+ polysilicon) or other material selected for compatibility with the data storage structure. A layer of silicon nitride which can be used to provide tensile stress, is deposited over a top layer, in this example. This layer can improve the uniformity of the stacks and reduce bending, when they are etched with high aspect ratios and narrow lines. The layers of insulating material can comprise silicon dioxide deposited in a variety of ways as known in the art. Also, the layers of insulating material can comprise other insulating materials, and combinations of insulating materials. In this example, all of the insulating layers consist of the same material. In other examples, different materials can be used in different layers as suits a particular design goal. After the plurality of layers is formed, a patterned etch is applied to form a plurality of stacks of conductive strips separated by insulating strips.

FIG. 3 illustrates a stage of the process after etching the plurality of layers to define a plurality of stacks of conductive strips, such as a stack 101 including conductive strips 311, 312 and 313 separated by insulating strips 301, 302, 303 and 304, and a stack 102 including conductive strips 321, 322 and 323 separated by insulating strips 301, 302, 303 and 304. The stacks include at least a plurality of intermediate planes (WLs) of conductive strips configured as word lines (e.g. 311, 312, 313, 321, 322 and 323). Although not shown, the stacks can include a top plane of conductive strips configured as string select lines (SSL) and a bottom plane of conductive strips configured as ground select lines (GSL). Alternatively, the memory device can include pairs of a first stack and a second stack, where the first stack can include a top plane of conductive strips configured as string select lines (SSL), the second stack can include a top plane of conductive strips configured as ground select lines (GSL), and a pair of vertical channel films disposed on the first and second stacks in the pair can be connected at ends distal to the string select lines and the ground select lines. The plurality of intermediate planes can include N planes, ranging from 0 to N−1 for the stack. Although not shown, the conductive strips are linked by pads which can be defined in the pattern used for etching the stacks.

Figure 4:
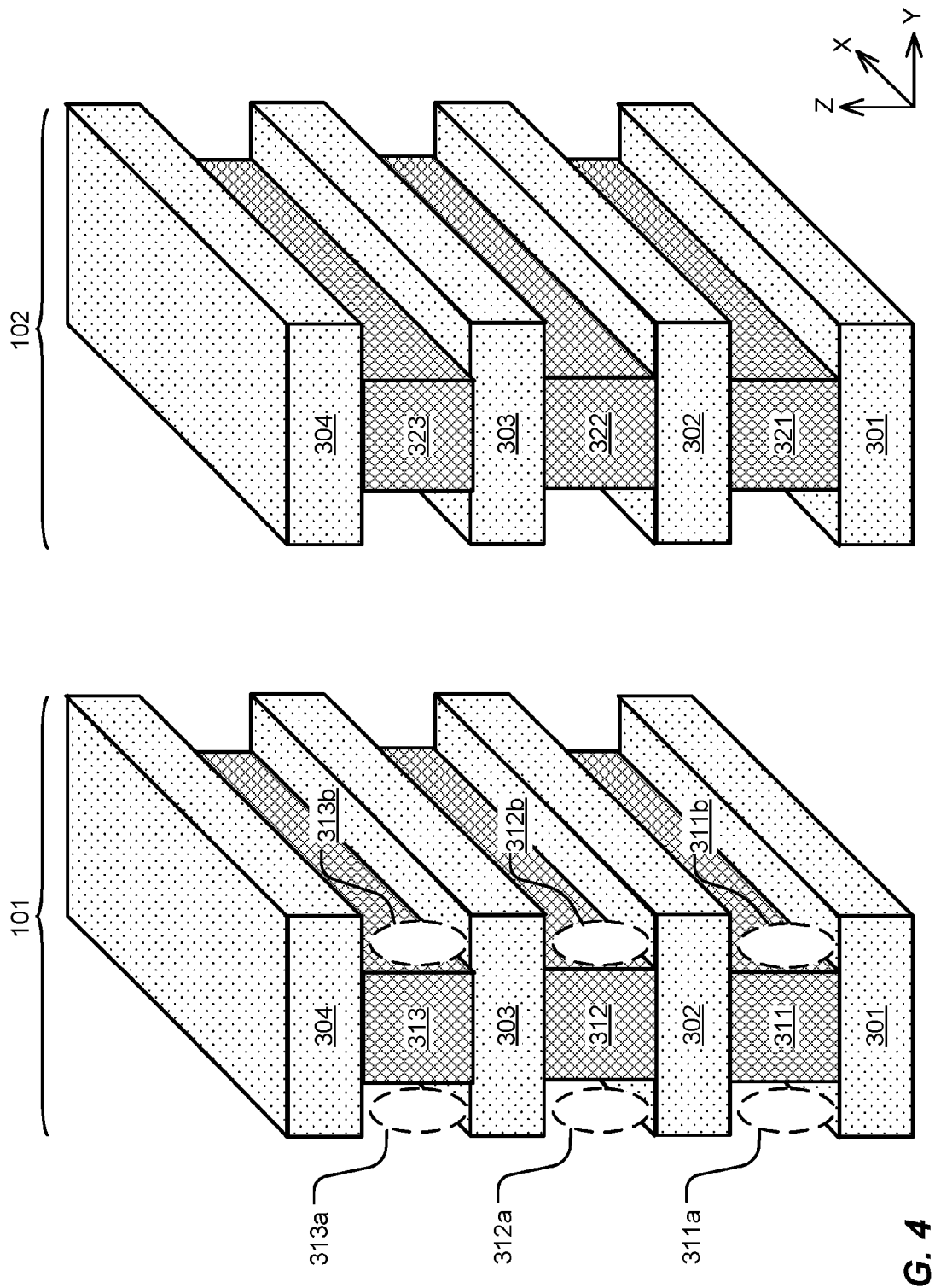
Figure 6:
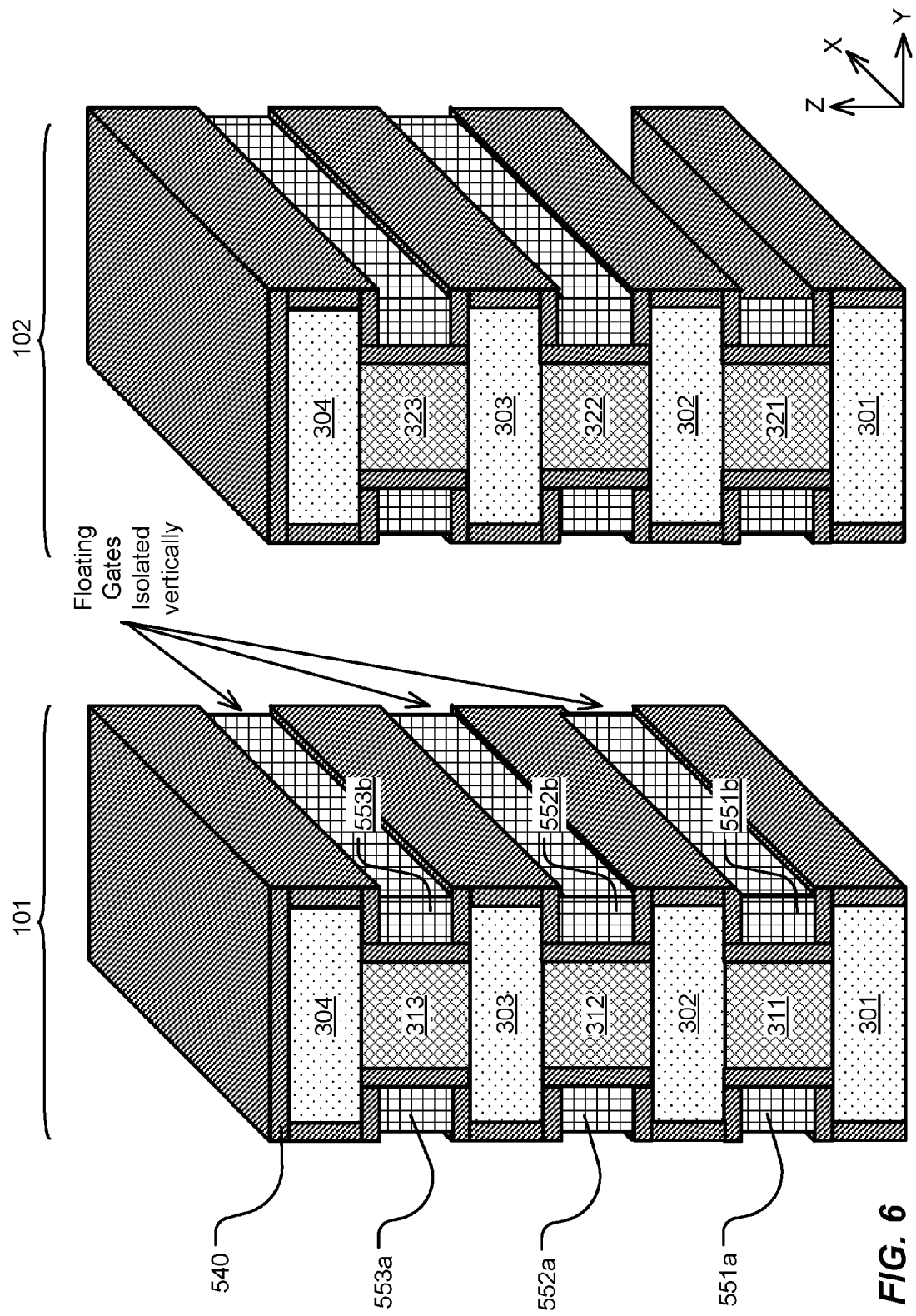

FIGS. 4-6 illustrate forming data storage structures including floating gates disposed along the conductive strips in the stacks in the X-direction. FIG. 4 illustrates a stage of the process flow after etching the conductive strips to form lateral recesses on sides of the conductive strips. For instance, lateral recesses 311a and 311b are formed on sides of the conductive strip 311, lateral recesses 312a and 312b are formed on sides of the conductive strip 312, and lateral recesses 313a and 313b are formed on sides of the conductive strip 313.

FIG. 5 illustrates a stage of the process flow after depositing a layer of inter-gate dielectric material (e.g. 540) on surfaces of the conductive strips and insulating strips in the lateral recesses (e.g. 545, 546, 547), and a layer of floating gate material (e.g. 550) over the layer of inter-gate dielectric material in the lateral recesses. The inter-gate dielectric material and the floating gate material are as described in connection with FIG. 1.

FIG. 6 illustrates a stage of the process flow after applying a self-aligned process to isolate the floating gates vertically, without the need for an etch mask. The self-aligned process includes an isotropic poly etch to the structure shown in FIG. 5 to form a floating gate in a particular lateral recess isolated from floating gates in lateral recesses vertically adjacent to the particular lateral recess. For instance, a floating gate 552b in a particular lateral recess 312b is isolated from floating gates 551b and 553b in lateral recesses 311b and 313b vertically adjacent to the particular lateral recess 312b.

The floating gates (e.g. 552a, 552b) thus formed are along the conductive strips (e.g. 312) in the stacks in the X-direction, and coplanar with the conductive strips (e.g. 312) in the stacks in the Z-direction. Likewise, the floating gates (e.g. 551a, 551b) thus formed are along the conductive strips (e.g. 311) in the stacks in the X-direction, and coplanar with the conductive strips (e.g. 311) in the stacks in the Z-direction. The floating gates (e.g. 553a, 553b) thus formed are along the conductive strips (e.g. 313) in the stacks in the X-direction, and coplanar with the conductive strips (e.g. 313) in the stacks in the Z-direction.

FIG. 7 illustrates a stage of the process flow after forming vertical channel films on sidewalls of the stacks in the plurality of stacks. To form the structure shown in FIG. 7, a tunnel oxide layer (e.g. 745) is deposited on sidewalls of the stacks in the plurality of stacks, including on sidewalls of the floating gates in the lateral recesses in the plurality of stacks of conductive strips. The tunnel oxide layer (e.g. 745) can include a conventional tunnel oxide such as silicon dioxide (SiO2), a barrier engineered tunnel oxide, or a bandgap engineered tunnel oxide.

A thin-film semiconductor layer (e.g. 750) is then deposited over and on the tunnel oxide layer (e.g. 745). The semiconductor material in the thin-film semiconductor layer 750 includes a semiconductor adapted by choice of material, e.g. silicon, and doping concentrations (e.g. undoped or lightly doped) to act as channel regions for vertical strings of memory cells, at least in the regions between the stacks. The thin-film semiconductor layer 750 can have a thickness of about 10 nanometers or less. The thin-film semiconductor layer (e.g. 750) can be a thin polysilicon film, or semiconductor materials such as SiGe, SiC, etc.

Figure 8:
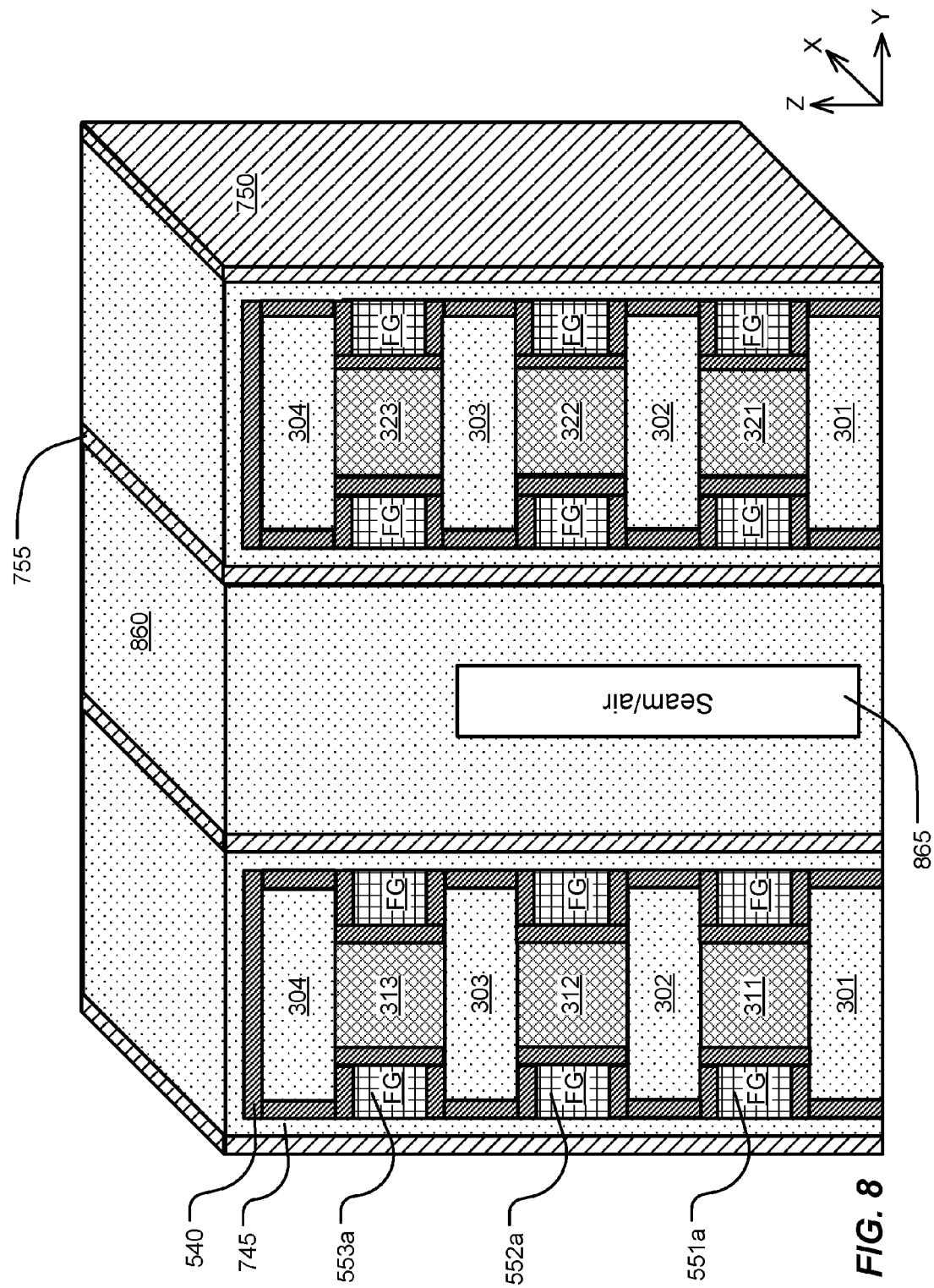

FIG. 8 illustrates a stage in the process flow after performing a step to fill between stacks on the inside surfaces of the thin-film semiconductor layer (e.g. 750) with an insulating fill (e.g. 860) such as silicon dioxide, leaving an air gap (e.g. 865) at least in regions adjacent the intermediate layers of conductive strips. After the fill step, an etch back or planarizing step such as chemical mechanical polishing can be applied to expose the top surface (e.g. 755) of the thin-film semiconductor layer (e.g. 750).

Figure 9:
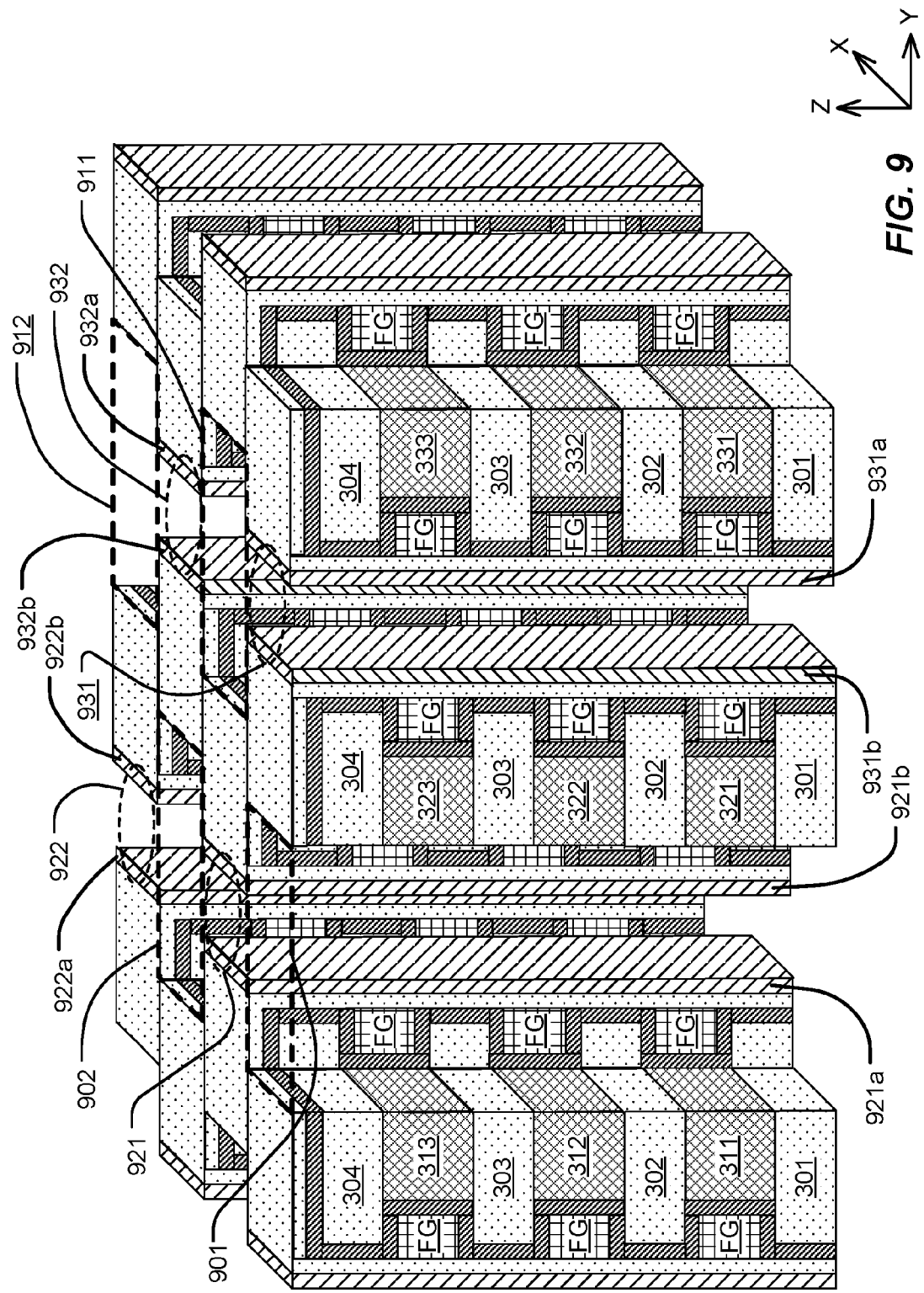

FIG. 9 illustrates a stage in the process flow after etching the vertical channel films and the data storage structures to define a plurality of memory cells having channels in the vertical channel films, and control gates in the conductive strips. The structure includes a plurality of stacks of conductive strips, such as a first stack including conductive strips 311, 312 and 313, a second stack including conductive strips 321, 322 and 323, and a third stack including conductive strips 331, 332 and 333. To form the structure shown in FIG. 9, a bit line cut etch is applied to isolate the floating gates FG in the X-direction. The bit line cut includes etching holes (e.g. 901, 902, 911, 912) between the stacks through the thin-film semiconductor layer (e.g. 750) and data storage structures including the floating gates (FG). The bit line cut etch is a non-selective etch that can etch both the oxide layers and the polysilicon layers.

As a result of the holes (e.g. 901, 902, 911, 912), a plurality of vertical channel structures (e.g. 921, 922, 931, 932) is formed. A vertical channel structure in the plurality of vertical channel structures includes vertical channel films on adjacent stacks with the insulating fill (e.g. 860, FIG. 8) between the vertical channel films in the vertical channel structure. For instance, vertical channel structures 921, 922, 931 and 932 include vertical channel films 921a and 921b, 922a and 922b, 931a and 931b, and 932a and 932b, respectively. As illustrated in FIG. 9, the vertical channel structures (e.g. 921, 922, 931, 932) are laid out in a honeycomb arrangement, so that each row of vertical channel structures is offset in the row direction (e.g. Y-direction) from adjacent rows of vertical channel structures. This honeycomb arrangement facilitates formation of overlying bit lines with a tighter pitch. Insulating fill is applied in the holes between the vertical channel structures to form insulating structures (e.g. 1101, 1102, 1103, 1111, 1112, 1113, FIG. 11).

Figure 10A:
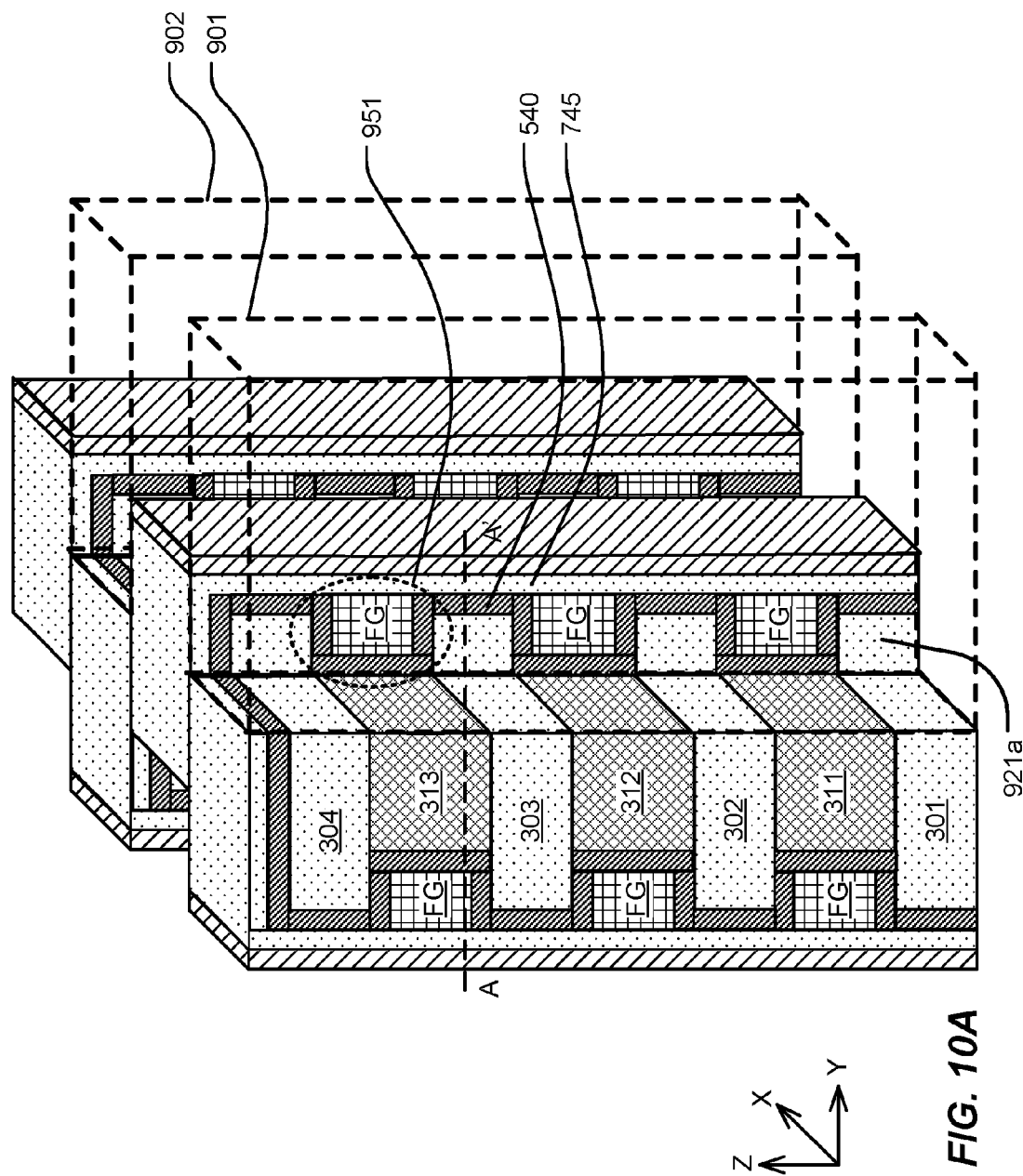
Figure 16:
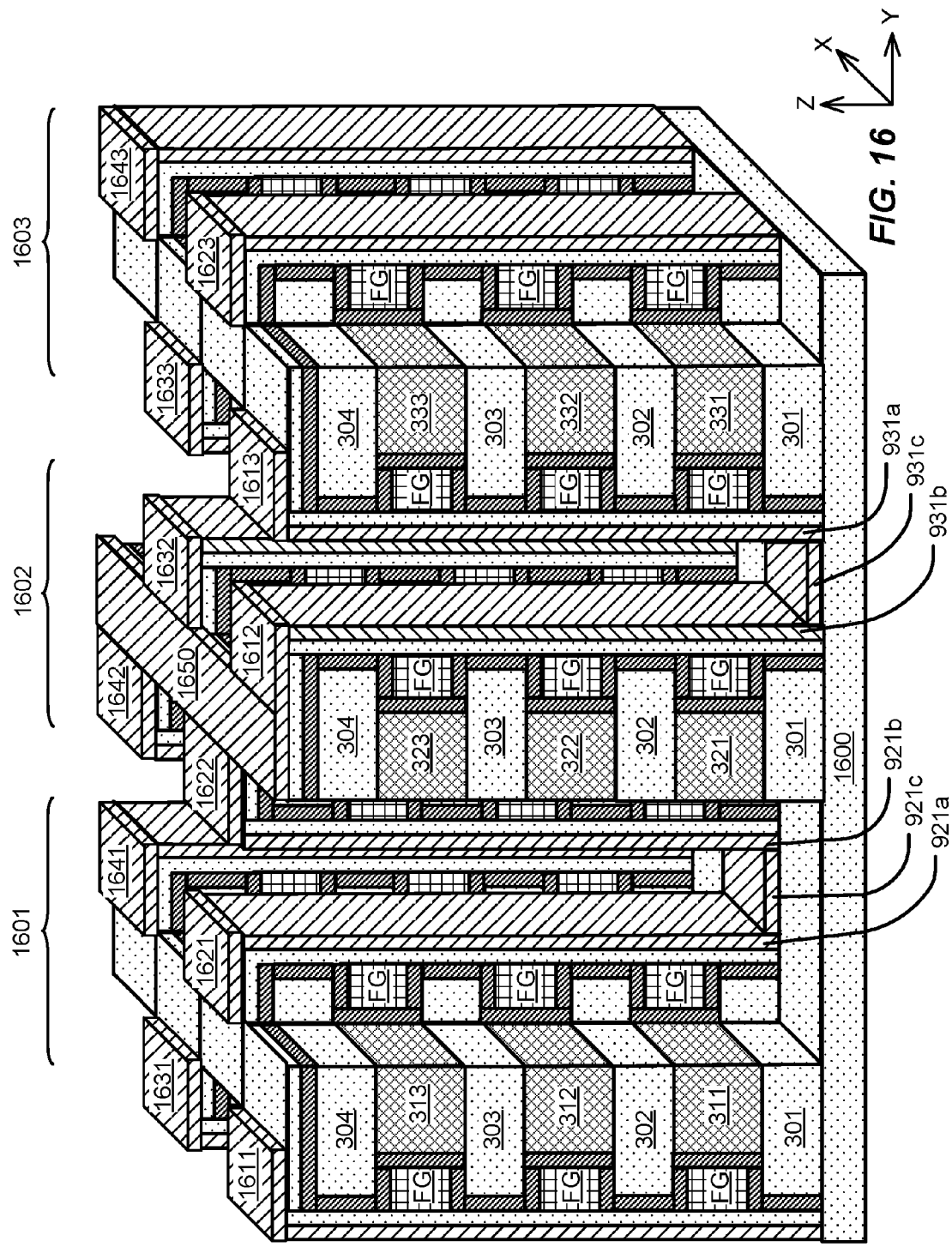
FIGS. 16, 17, 18, 19, 20 and 21 illustrate a SVGC 3D NAND memory device with floating gate memory cells having a U-shaped structure.

FIG. 10A illustrates a stack shown in FIG. 9 in more details. The holes (e.g. 901) extend in this example through the oxide layers and the polysilicon layers including insulating strips (e.g. 301, 302, 303, 304) and conductive strips (e.g. 311, 312, 313), to expose a bottom substrate on which the plurality of stacks of conductive strips is formed (FIG. 12), or to expose an insulating layer on which the plurality of stacks of conductive strips is formed (FIG. 16).

A floating gate in a memory cell in the plurality of memory cells is isolated in three dimensions. For instance, the floating gate FG in memory cell 951 is isolated by the layer of inter-gate dielectric material 540 on the top and the bottom in the Z-direction, by the layer of inter-gate dielectric material 540 on the left and by the tunnel oxide layer 745 on the right in the Y-direction, and by an insulating structure 1101 (FIG. 11) in the etching hole 901 in the front and by another insulating structure 1102 (FIG. 11) in the etching hole 902 in the back in the X-direction.

Figure 10B:
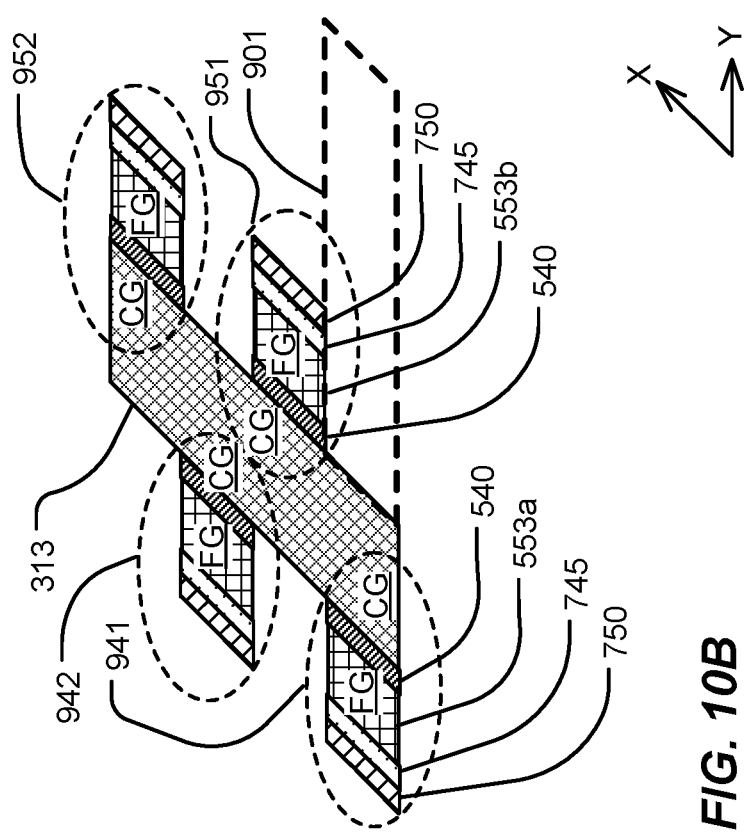

FIG. 10B shows a cross-section of the stack shown in FIG. 10A, in the X-Y plane taken at a word line layer (e.g. AA'). As shown in the example of FIG. 10B, memory cells (e.g. 941, 942) in the plurality of memory cells having control gates (CG) in a particular conductive strip (e.g. 313) in the stacks of conductive strips have floating gates (e.g. 553a) on a first side of the particular conductive strip (e.g. 313), and adjacent memory cells (e.g. 951, 952) in the plurality of memory cells having control gates (CG) in the particular conductive strip (e.g. 313) have floating gates (e.g. 553b) on a second side of the particular conductive strip (e.g. 313) opposite the first side.

Figure 11:
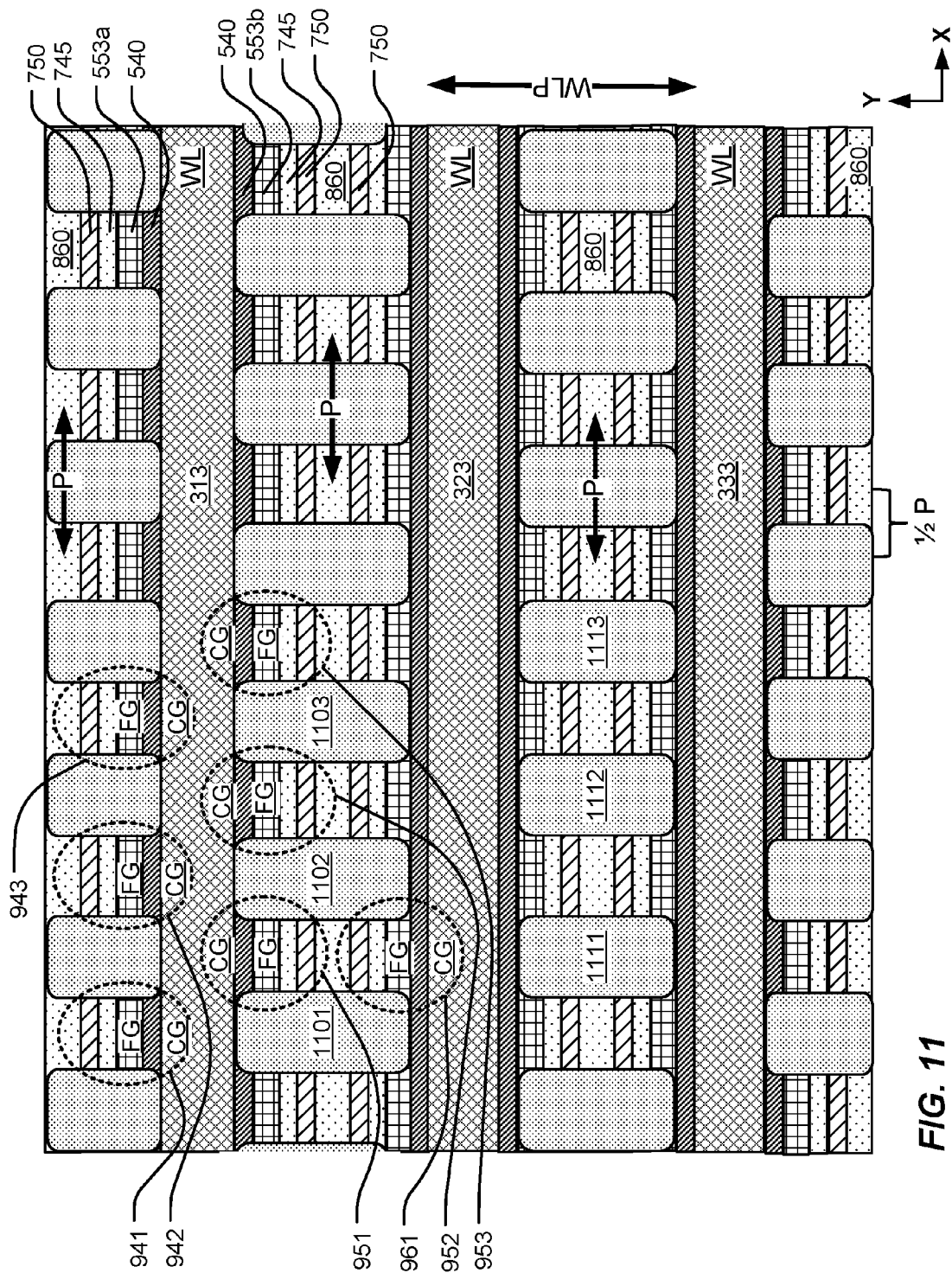
FIG. 11 illustrates in layout view one embodiment of a SVGC 3D NAND memory device with floating gate memory cells having a bottom source structure.

FIG. 11 illustrates in layout view one embodiment of a SVGC 3D NAND memory device with floating gate memory cells having a bottom source structure. FIG. 11 is a cross-section taken in the X-Y plane through an intermediate layer in the 3D block, intersecting conductive strips configured as word lines (WL). The cross-section through a layer in the block illustrates a layout view with an insulating fill between the vertical channel structures providing insulating structures (e.g. 1101, 1102, 1103, 1111, 1112, 1113) isolating the channels of adjacent cells along a conductive strip. In the layout, the conductive strips 313, 323 and 333 are illustrated. Each of the conductive strips is disposed in a separate stack of conductive strips.

Memory cells (e.g. 941, 942, 943) in the plurality of memory cells having control gates CG in a particular conductive strip (e.g. 313) in the stacks of conductive strips have floating gates FG (e.g. 553a) on a first side of the particular conductive strip (e.g. 313), and adjacent memory cells (e.g. 951, 952, 953) in the plurality of memory cells having control gates CG in the particular conductive strip (e.g. 313) have floating gates FG (e.g. 553b) on a second side of the particular conductive strip (e.g. 313) opposite the first side. The memory cells (e.g. 941, 942, 943) are in rows of memory cells in a row direction (e.g. Y-direction), while adjacent memory cells (e.g. 951, 952, 953) are in adjacent rows of memory cells in the row direction. For instance, a memory cell 942 is in a row of memory cells in the row direction, while adjacent memory cells 951 and 952 are in adjacent rows of memory cells in the row direction. Another memory cell 943 is in a row of memory cells in the row direction, while adjacent memory cells 952 and 953 are in adjacent rows of memory cells in the row direction.

A layer of inter-gate dielectric material (e.g. 540) is disposed between the conductive strips (e.g. 313) and the floating gates FG (e.g. 553*a*, 553*b*). A tunnel oxide layer (e.g. 745) is disposed between the floating gates FG (e.g. 553*a*, 553*b*) and the thin-film semiconductor layer 750. The insulating fill (e.g. 860) within a vertical channel structure separates the memory cells between adjacent stacks (e.g. 951 and 961), where the memory cell 951 includes the thin-film semiconductor layer disposed on the sidewall of a stack of conductive strips including the conductive strip 313, and the memory cell 961 includes the thin-film semiconductor layer disposed on the sidewall of an adjacent stack of conductive strips including the conductive strip 323.

The memory cells along a first side of a conductive strip (e.g. cells 941, 942, 943) are arranged with a uniform pitch P in the X direction along the first side of the conductive strip 313. Also, the cells along a second side of the same conductive strip opposite the first side (e.g. cells 951, 952, 953) are arranged with a uniform pitch P in the X direction along the second side of the conductive strip 313. In this embodiment, the cells on the first side of the conductive strip are offset in the X direction by one half of the uniform pitch (½ P) from the cells on the second side of the conductive strip. This results in a twisted layout allowing a tighter pitch for overlying bit lines. The length of the pitch P in the X-direction is selected to meet manufacturing requirements for the formation of the stacks of conductive strips, and the structures on the sidewalls of the stacks as described above. In some examples, the pitch P can be on the order of 50 to 100 nm. The word line pitch WLP in the Y direction can be about 300 nm.

The vertical channel films can have thicknesses less than 10 nm (nanometers) or on the order of 5 nm to 15 nm. The tunnel oxide layer can have thicknesses less than 7 nm (nanometers) or on the order of 6 nm to 10 nm. The floating gates can have thicknesses less than 20 nm or on the order of 10 nm to 30 nm. The layer of inter-gate dielectric material can have thicknesses less than 15 nm (nanometers) or on the order of 12 nm to 22 nm.

FIGS. 12, 13, 14 and 15 illustrate a SVGC 3D NAND memory device with floating gate memory cells having a bottom source structure. FIGS. 12, 13 and 14 and 15 illustrate the structure after stages in the process flow that include formation of pads between two adjacent stacks, and formation of one or more patterned conductor layers over the plurality of stacks, including a bit line, and interlayer connectors connecting the bit line to the pad.

Figure 12:
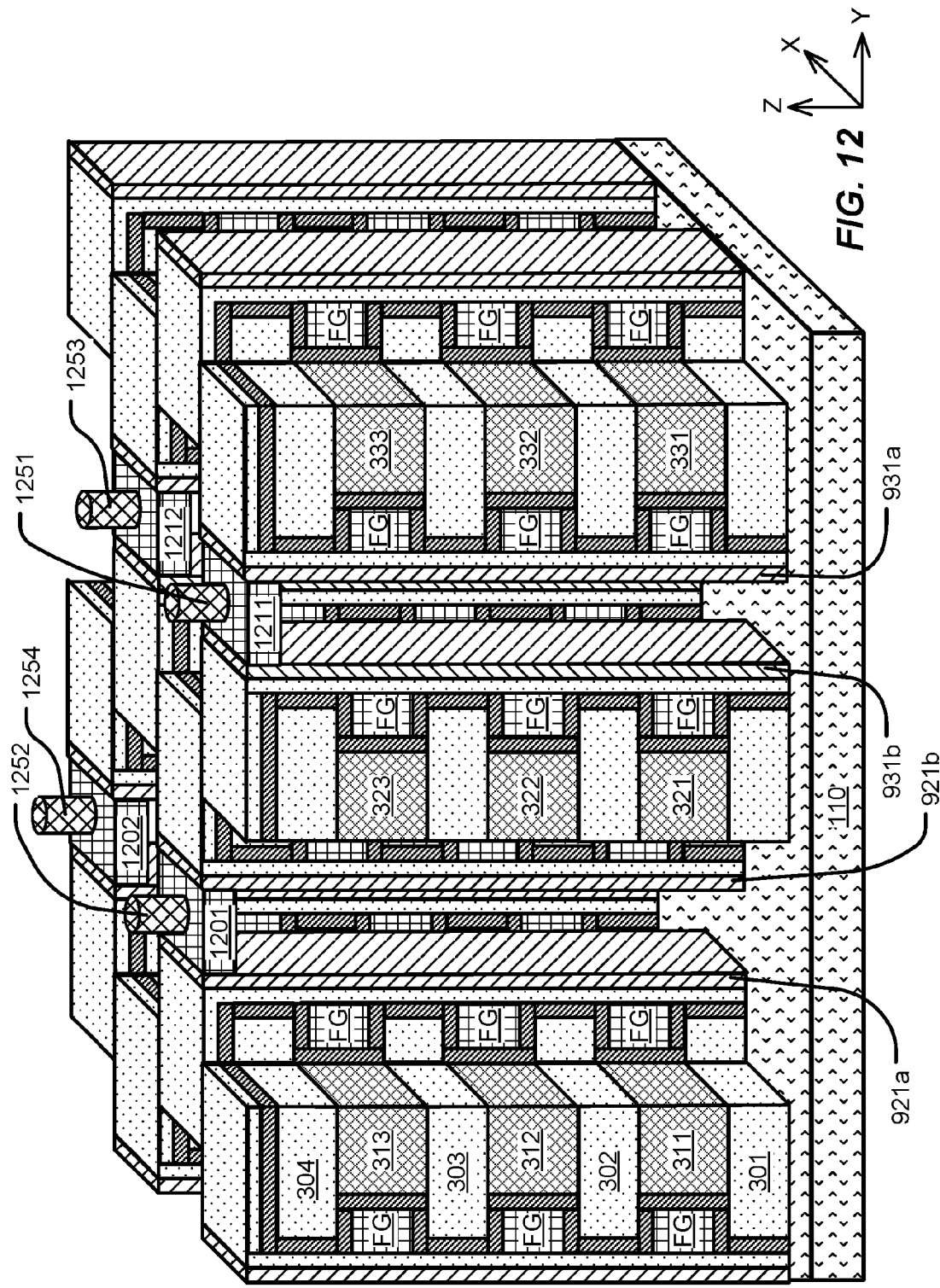
FIGS. 12, 13, 14 and 15 illustrate a SVGC 3D NAND memory device with floating gate memory cells having a bottom source structure.

FIG. 12 illustrates the structure after a stage in the process flow that includes formation of pads (e.g. 1201, 1202, 1211, 1212) between two adjacent stacks at ends of the vertical channel films (e.g. 921*a*, 921*b*, 931*a*, 931*b*) distal to a substrate (e.g. 110), where the vertical channel films are connected to the substrate below the plurality of stacks, and a pair of vertical channel films in the vertical channel films on two adjacent stacks in the plurality of stacks are connected via the pad.

The stage in the process flow includes formation of an array of contact plugs (e.g. 1251, 1252, 1253, 1254) through an interlayer dielectric (not shown), landing on corresponding pads (e.g. 1211, 1201, 1212, 1202). The process can include formation of a layer of interlayer dielectric such as silicon oxide on top of the array, which can be for example about 100 nm to 500 nm thick, followed by formation of vias through the interlayer dielectric exposing the landing areas on the pads. The contact plugs can comprise a polysilicon plug, or other material which is compatible with the conductive material used at the upper surfaces of the vertical channel structures. The contact plugs (e.g. 1251, 1252, 1253, 1254) provide for electrical connection to the pads (e.g. 1211, 1201, 1212, 1202).

Figure 13:
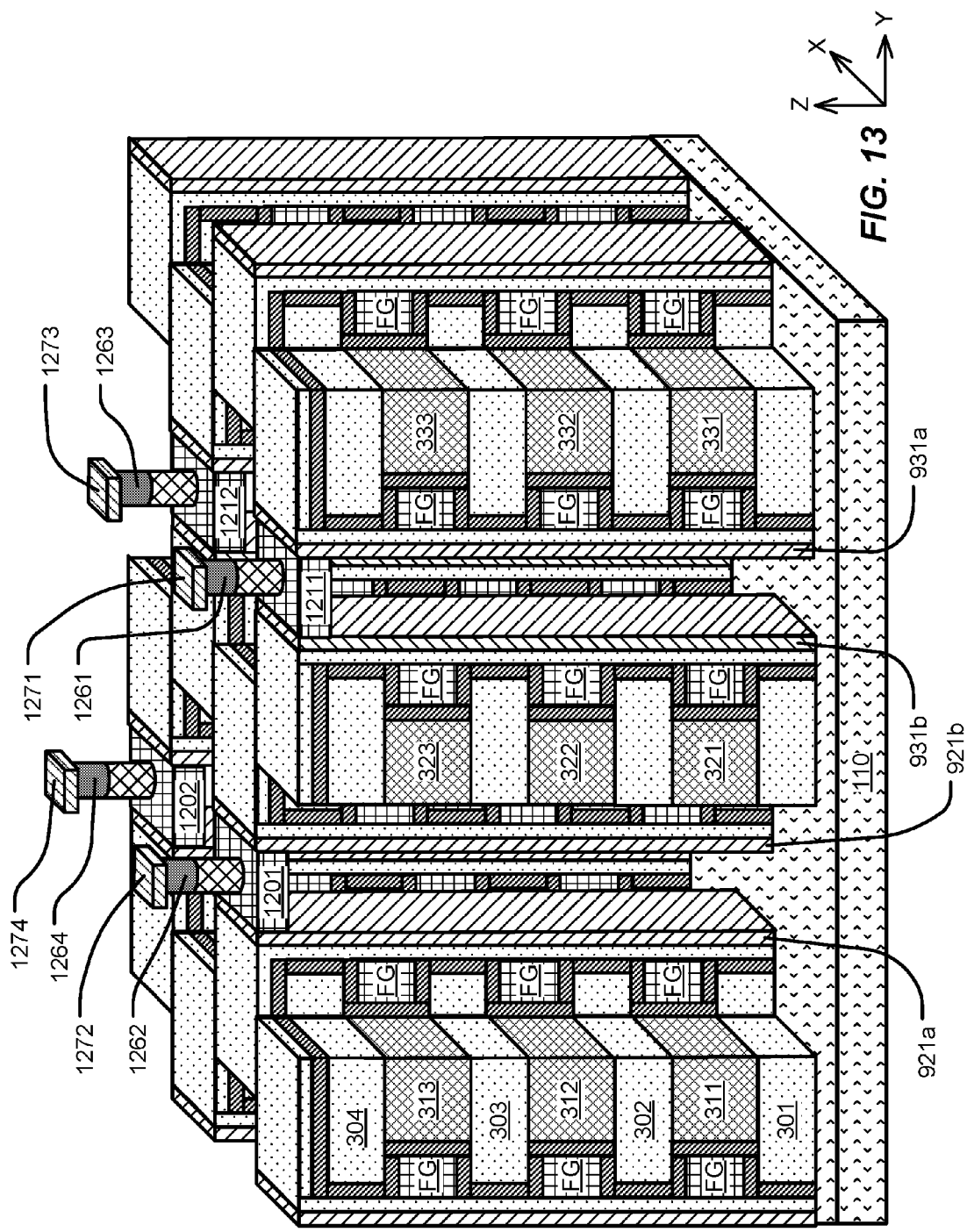

FIG. 13 illustrates the structure after a stage in the process flow that includes formation of interlayer connectors (e.g. 1261, 1262, 1263, 1264) on the contact plugs (e.g. 1251, 1252, 1253, 1254). The interlayer connectors can comprise tungsten plugs or other metal materials in an interlayer dielectric which overlies an interlayer dielectric (not shown). The interlayer connectors (e.g. 1261, 1262, 1263, 1264) are aligned over and make electrical contact with the polysilicon plug contacts (e.g. 1251, 1252, 1253, 1254) in this example. The alignment can be carried out using a borderless silicon nitride process or other technique which provides for good electrical connection to the underlying polysilicon plugs in this embodiment. In other embodiments, interlayer connection can be made using other combinations of materials, or using a single interconnection plug.

The stage in the process flow includes formation of a first patterned conductor layer, including posts (e.g. 1271, 1272, 1273, 1274) in contact with the interlayer connectors (e.g. 1261, 1262, 1263, 1264). The posts (e.g. 1271, 1272, 1273, 1274) provide for interconnection of the NAND strings through the first patterned conductor layer to overlying patterned conductor layers as described below.

Figure 14:
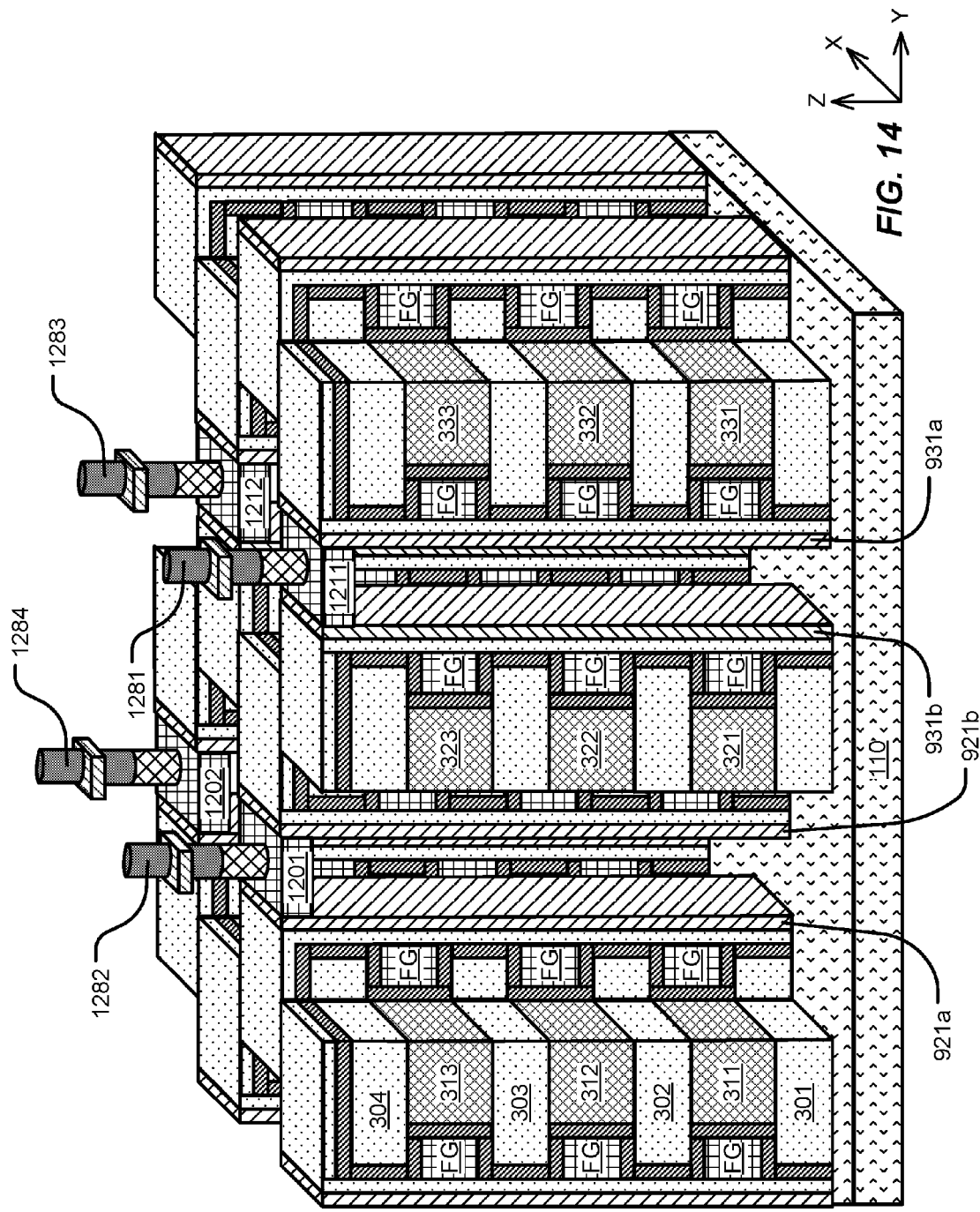

FIG. 14 illustrates the structure after a stage in the process flow that includes formation of interlayer connectors (e.g. 1281, 1282, 1283, 1284) for making connection of the NAND strings to overlying patterned conductors via the posts (e.g. 1271, 1272, 1273, 1274). The interlayer connectors (e.g. 1281, 1282, 1283, 1284) can have an oval or elongated shape with a more narrow width (e.g. about 20 nm) in the X dimension to facilitate connection to a dense pattern of overlying bit lines.

Figure 15:
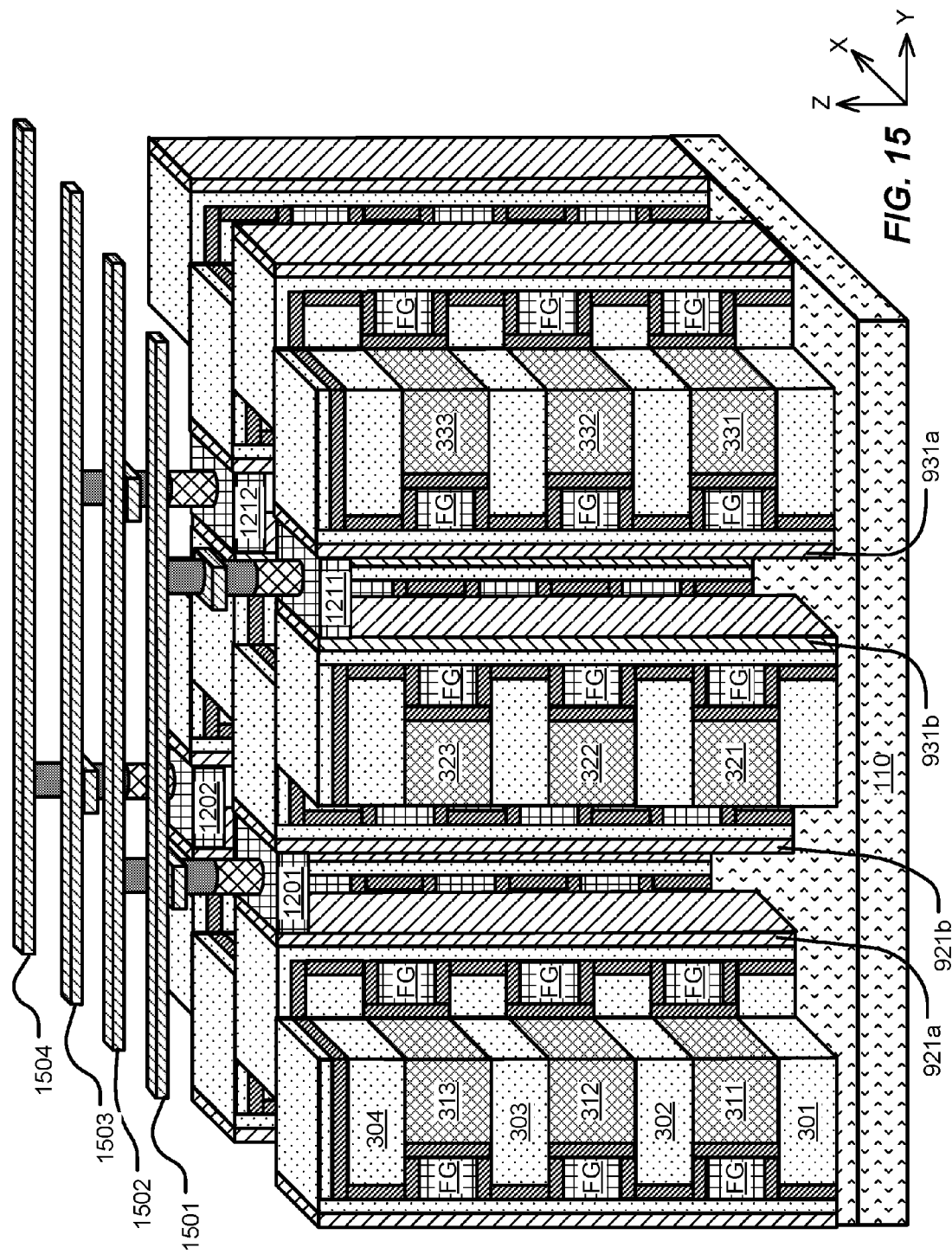

FIG. 15 illustrates the structure after applying a second patterned conductor layer, such as a metal layer in a process flow, over the interlayer connectors 1281, 1282, 1283, 1284. The second patterned conductor layer includes bit lines 1501, 1502, 1503 and 1504 in this example, connected to the pads 1211, 1201, 1212 and 1202 respectively. The bit lines can be patterned using a self-aligned double patterning SADP process to achieve a narrow pitch.

FIGS. 16, 17, 18, 19, 20 and 21 illustrate a SVGC 3D NAND memory device with floating gate memory cells having a U-shaped structure. FIGS. 16, 17, 18, 19, 20 and 21 illustrate the structure after stages in the process flow that include formation of a first pad over a first stack and a second pad over a second stack in a pair of adjacent stacks, where first and second vertical channel films on sidewalls of the first and second stacks are connected at ends distal to the first and second pads. The plurality of stacks of conductive strips including the pair of adjacent stacks is disposed on an insulating layer 1600 which can comprise a silicon oxide or other dielectric on a semiconductor substrate. The process flow also includes formation of one or more patterned conductor layers over the plurality of stacks, including a bit line and a source line, and interlayer connectors connecting the bit line to the first pad over the first stack and connecting the source line to the second pad over the second stack.

FIG. 16 shows the structure after doing a patterned etch to divide the thin-film semiconductor layer 750 over the stacks for the purposes of forming array connections. After the patterned etch, the thin-film semiconductor layer 750 is divided into first vertical channel films (e.g. 921a, 931a) disposed on first stacks (e.g. 1601, 1603), first pads (e.g. 1611, 1621, 1631, 1641, 1613, 1623, 1633, 1643) for connecting the first vertical channel films to the bit lines, second vertical channel films (e.g. 921b, 931b) disposed on second stacks (e.g. 1602), and second pads (e.g. 1612, 1622, 1632, 1642) for connecting the second vertical channel films to the source line via a portion (e.g. 1650) of the thin-film semiconductor layer 750. The first pads and second pads can be wide enough to overlie the vertical channel films, the tunnel oxide and the floating gates on sidewalls of the stacks. Although not shown in FIG. 16, the first stacks (e.g. 1603) can include a top plane of conductive strips configured as string select lines (SSL), and the second stacks (e.g. 1602) can include a top plane of conductive strips configured as ground select lines (GSL).

As shown in the example of FIG. 16, a vertical channel structure in a row of vertical channel structures includes first and second vertical channel films 931a and 931b on first and second stacks 1603 and 1602 in a pair of adjacent stacks in the plurality of stacks. The first vertical channel film 931a includes a first pad (e.g. 1613) over the first stack 1603 on an upper end of the first vertical channel film 931a, and the second vertical channel film 931b includes a second pad (e.g. 1612) over the second stack 1602 on an upper end of the second vertical channel film 931b. The first and second vertical channel films 931a and 931b are connected at ends (e.g. 931c) distal to the first and second pads to form a current path from the first pad 1613 over the first stack to the second pad 1612 over the second stack.

Likewise, a vertical channel structure in an adjacent row of vertical channel structures includes first and second vertical channel films 921a and 921b on first and second stacks 1601 and 1602 in a pair of adjacent stacks in the plurality of stacks. The first vertical channel film 921a includes a first pad (e.g. 1621) over the first stack 1601 on an upper end of the first vertical channel film 921a, and the second vertical channel film 921b includes a second pad (e.g. 1622) over the second stack 1602 on an upper end of the second vertical channel film 921b. The first and second vertical channel films 921a and 921b are connected at ends (e.g. 921c) distal to the first and second pads to form a current path from the first pad 1621 over the first stack to the second pad 1622 over the second stack.

Figure 17:
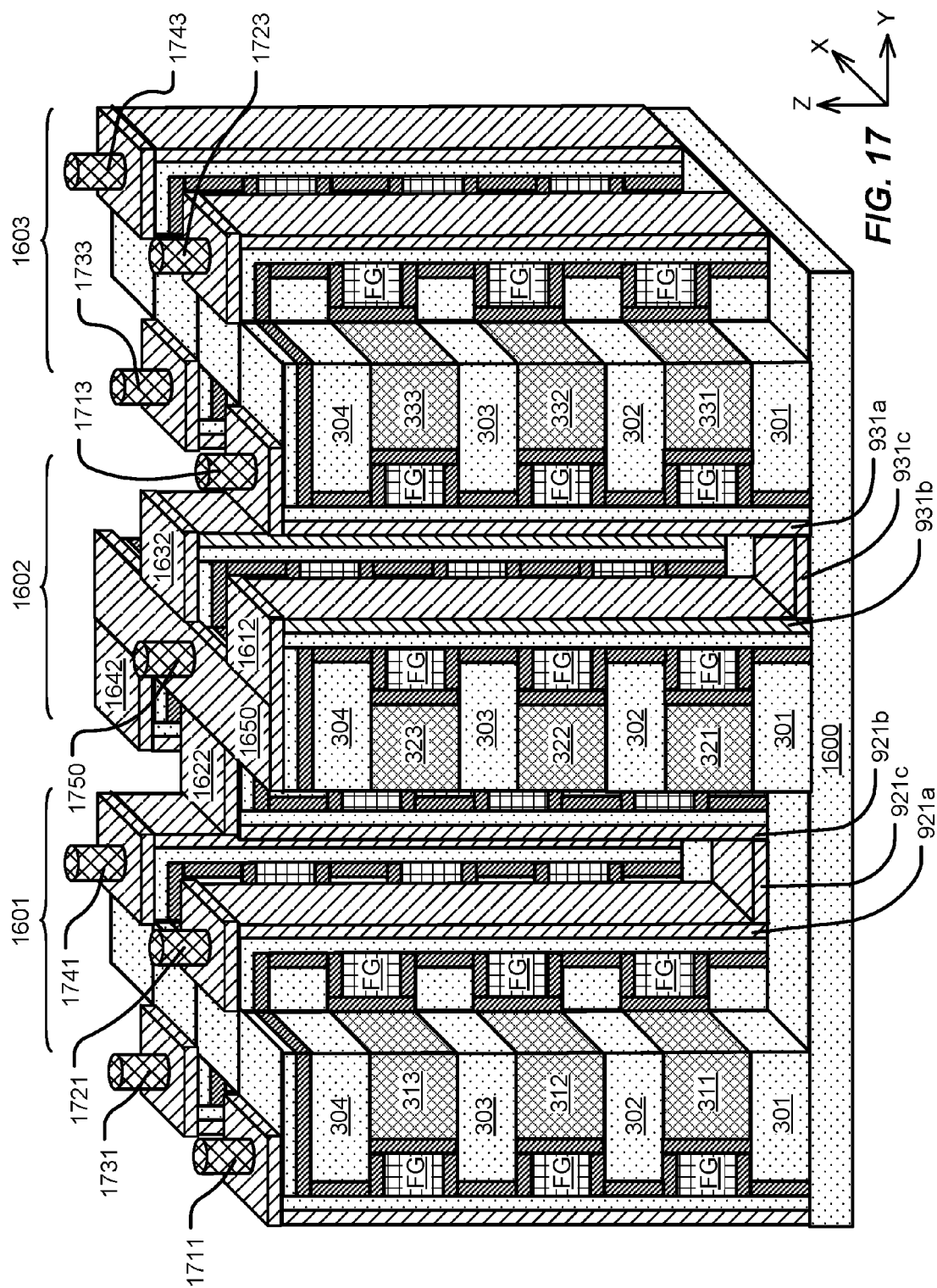

FIG. 17 illustrates the structure after a stage in the process flow that includes formation of first contact plugs (e.g. 1711, 1721, 1731, 1741, 1713, 1723, 1733, 1743) through an interlayer dielectric (not shown), landing on first pads (e.g. 1611, 1621, 1631, 1641, 1613, 1623, 1633, 1643), and a second contact plug (e.g. 1750) through the interlayer dielectric landing on second pad 1650. The process can include formation of a layer of interlayer dielectric such as silicon oxide on top of the array, which can be for example about 100 nm to 500 nm thick, followed by formation of vias through the interlayer dielectric exposing the landing areas on the pads. The first and second contact plugs can comprise a polysilicon plug, or other material which is compatible with the conductive material used at the upper surfaces of the vertical channel structures. The first and second contact plugs provide for electrical connection to the first and second pads.

Figure 18:
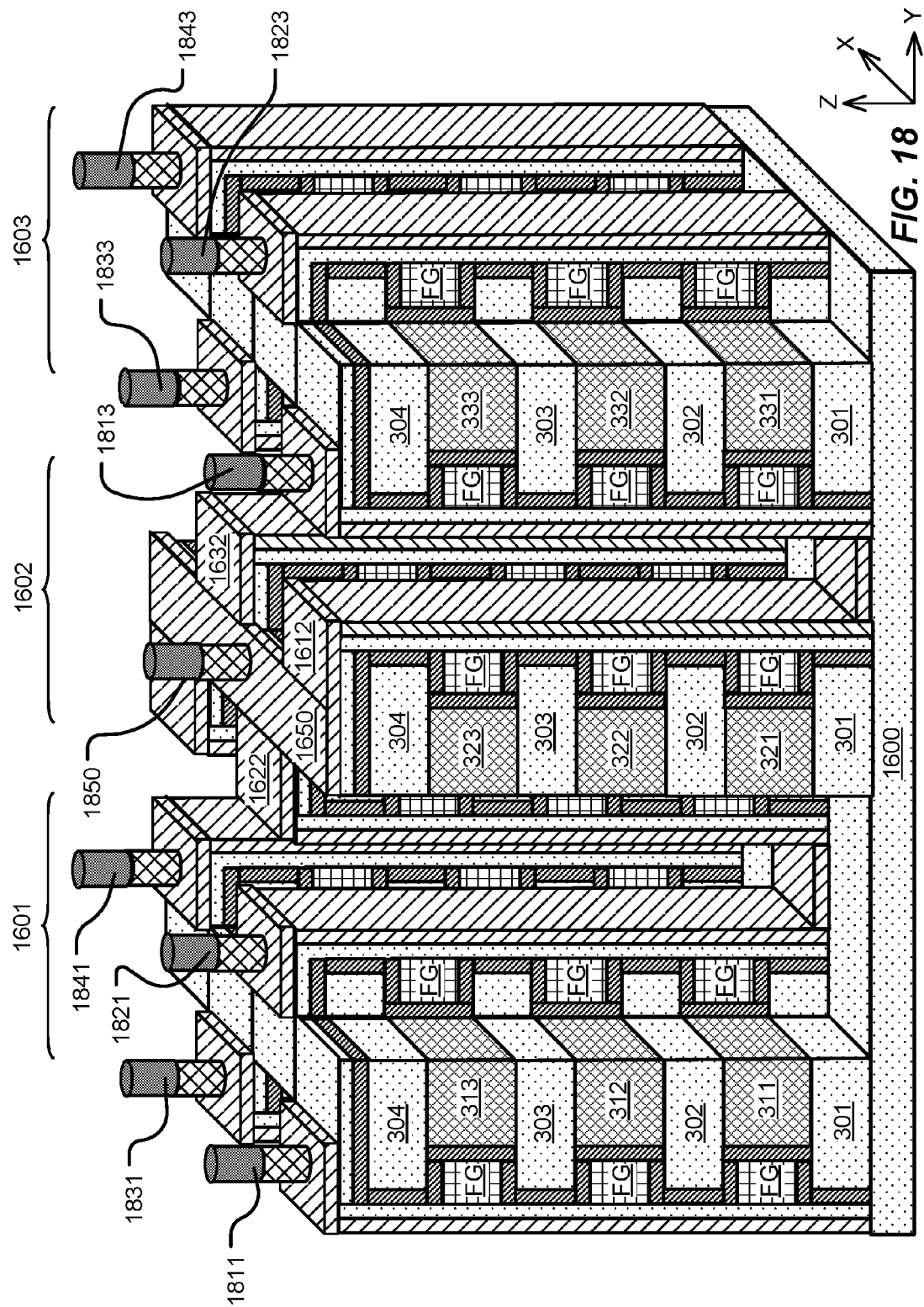

FIG. 18 illustrates the structure after a stage in the process flow that includes formation of interlayer connectors (e.g. 1811, 1821, 1831, 1841, 1850, 1813, 1823, 1833, 1843) on the contact plugs (e.g. 1711, 1721, 1731, 1741, 1750, 1713, 1723, 1733, 1743). The interlayer connectors can comprise tungsten plugs or other metal materials in an interlayer dielectric which overlies an interlayer dielectric (not shown). The interlayer connectors are aligned over and make electrical contact with the polysilicon plug contacts (e.g. 1711, 1721, 1731, 1741, 1750, 1713, 1723, 1733, 1743) in this example. The alignment can be carried out using a borderless silicon nitride process or other technique which provides for good electrical connection to the underlying polysilicon plugs in this embodiment. In other embodiments, interlayer connection can be made using other combinations of materials, or using a single interconnection plug.

Figure 19:
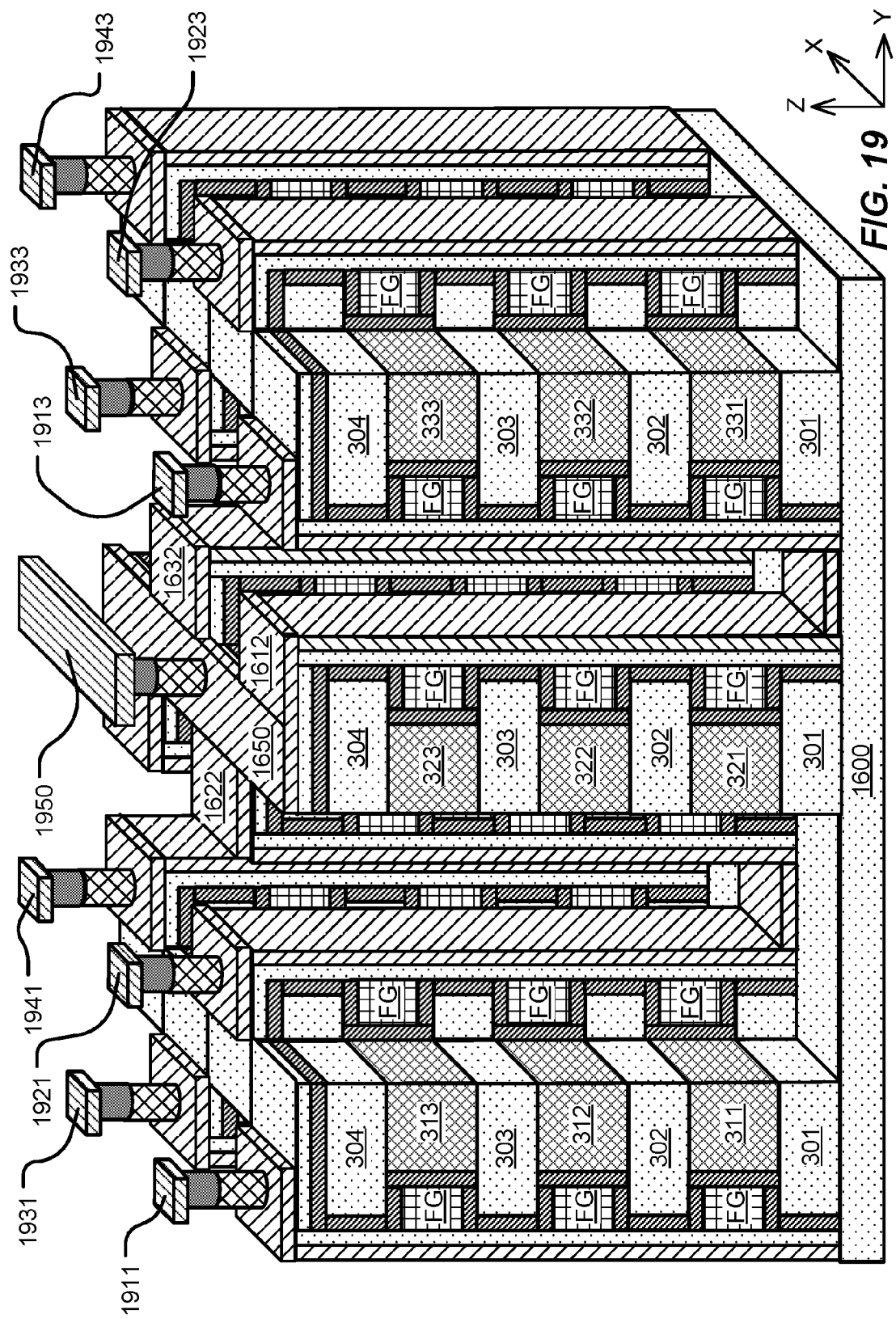

FIG. 19 illustrates the structure after a stage in the process flow that includes formation of a first patterned conductor layer, including a source reference conductor line 1950 and posts (e.g. 1911, 1921, 1931, 1941, 1913, 1923, 1933, 1943) in contact with the interlayer connectors (e.g. 1811, 1821, 1831, 1841, 1813, 1823, 1833, 1843). The source reference conductor line 1950 is connected to the GSL sides of the NAND strings via the interlayer connector 1850, and can be operated as common source lines in some array configurations. The posts (e.g. 1911, 1921, 1931, 1941, 1913, 1923, 1933, 1943) provide for interconnection of the NAND strings through the first patterned conductor layer to overlying patterned conductor layers as described below.

Figure 20:
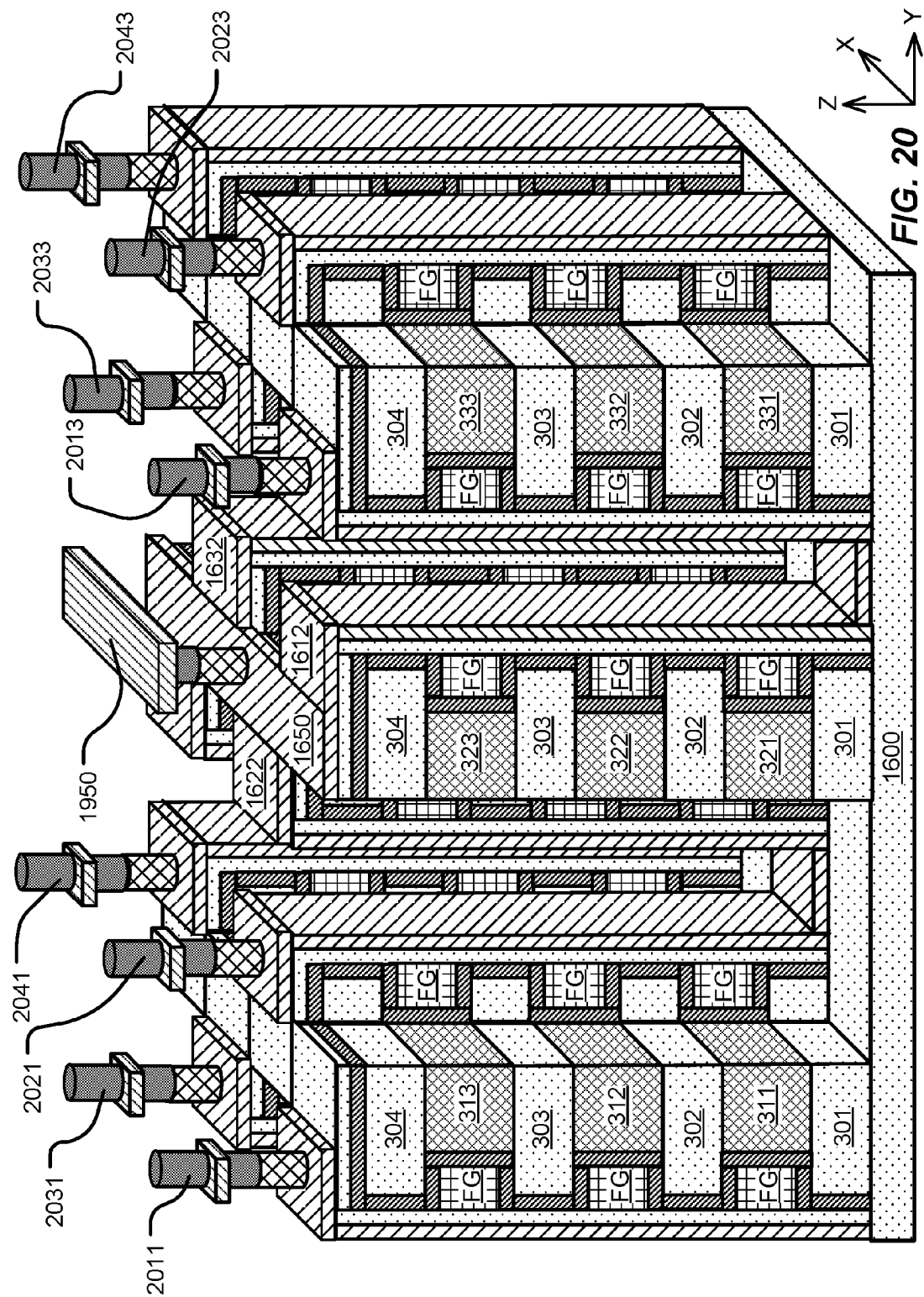

FIG. 20 illustrates the structure after a stage in the process flow that includes formation of interlayer connectors (e.g. 2011, 2021, 2031, 2041, 2013, 2023, 2033, 2043) for making connection of the NAND strings to overlying patterned conductors via the posts (e.g. 1911, 1921, 1931, 1941, 1913, 1923, 1933, 1943). The interlayer connectors (e.g. 2011, 2021, 2031, 2041, 2013, 2023, 2033, 2043) can have an oval or elongated shape with a more narrow width (e.g. about 20 nm) in the X dimension to facilitate connection to a dense pattern of overlying bit lines.

Figure 21:
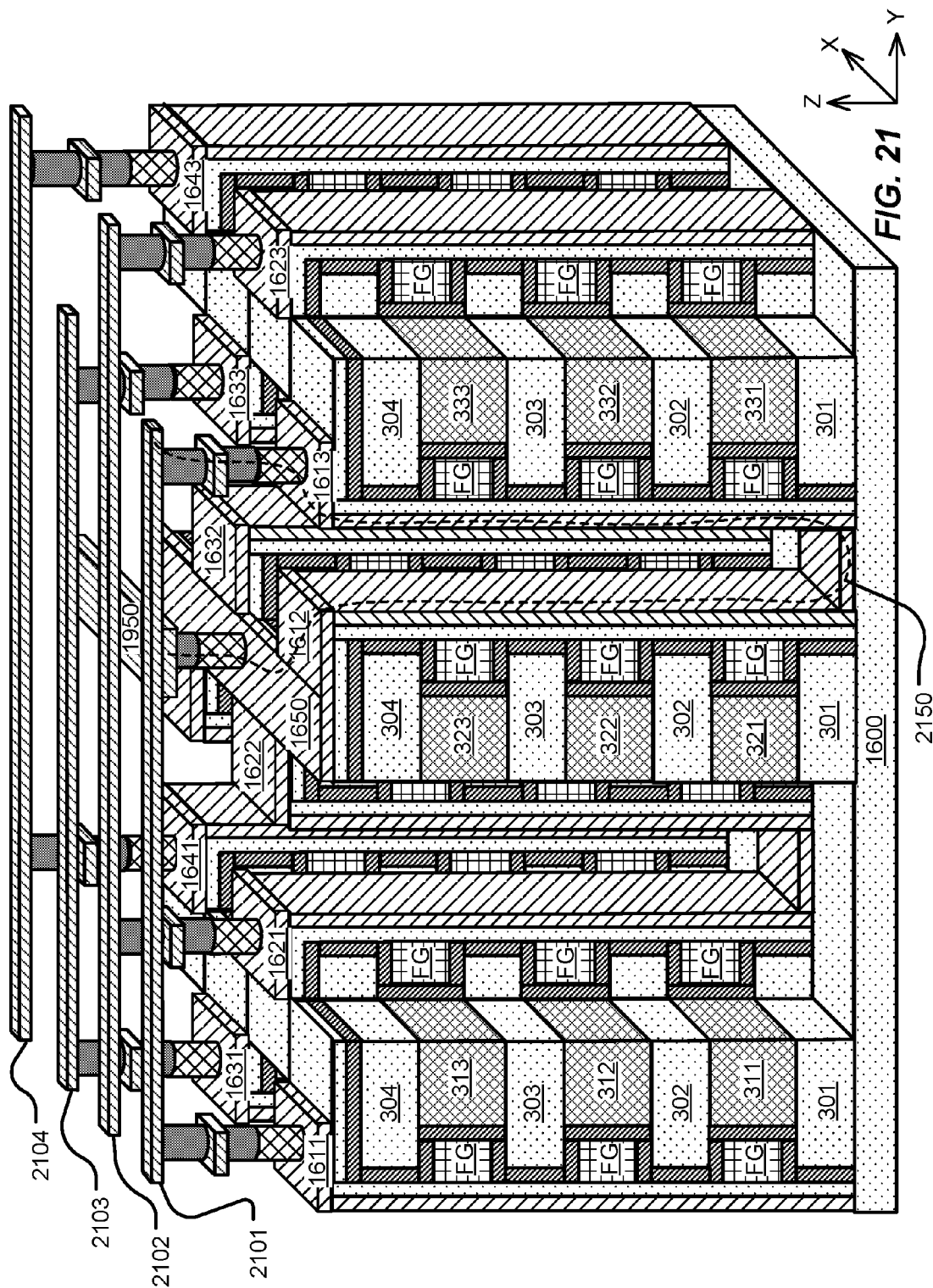

FIG. 21 illustrates the structure after applying a second patterned conductor layer, such as a metal layer in a process flow, over the interlayer connectors 2011, 2021, 2031, 2041, 2013, 2023, 2033, and 2043. As shown in the example of FIG. 21, the second patterned conductor layer includes bit lines 2101, 2102, 2103 and 2104. The bit lines can be patterned using a self-aligned double patterning SADP process to achieve a narrow pitch.

As illustrated in FIG. 21, portion 1650 of the thin-film semiconductor layer 750 which is connected to the vertical channel films (e.g. 931b, FIG. 17) on the GSL sides of NAND strings is connected by interlayer connectors to the source reference conductor line 1950 in the first patterned conductor layer, which acts as a source reference line. Pads 1611 and 1613 which are connected to SSL sides of NAND strings are connected by interlayer connectors to a first bit line 2101. Pads 1621 and 1623 which are connected to SSL sides of NAND strings are connected by interlayer connectors to a first bit line 2102. Pads 1631 and 1633 which are connected to SSL sides of NAND strings are connected by interlayer connectors to a third bit line 2103. Pads 1641 and 1643 which are connected to SSL sides of NAND strings are connected by interlayer connectors to a fourth bit line 2104.

A circuit path 2150 is shown in FIG. 21 illustrating the current flow for a U-shaped NAND string with a floating gate structure which is connected between the source reference conductor line 1950 and in the bit line 2101.

Figure 22:
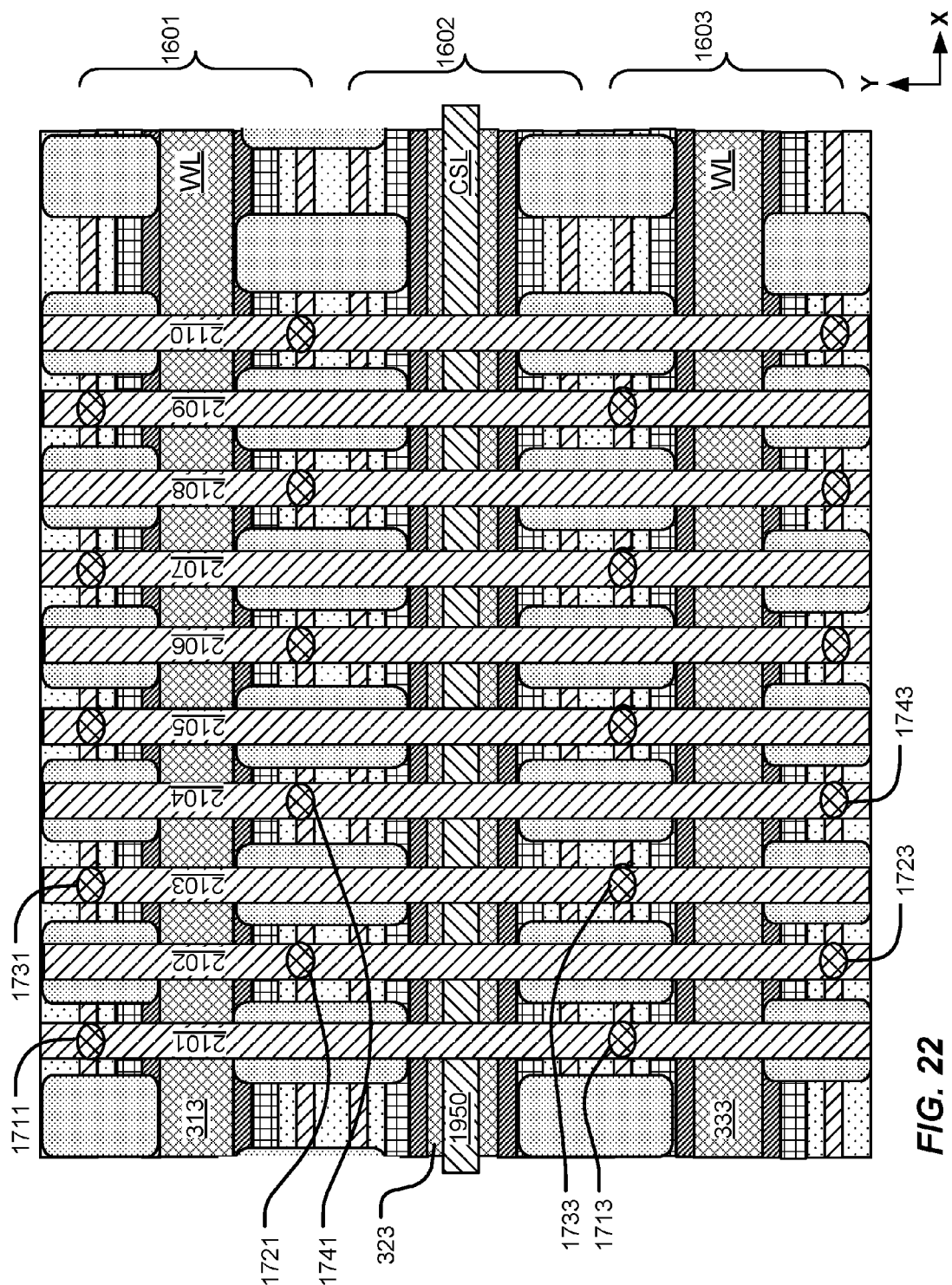
FIG. 22 illustrates in layout view an alternative embodiment of a SVGC 3D NAND memory device with floating gate memory cells having a U-shaped structure.

FIG. 22 illustrates in layout view an alternative embodiment of a SVGC 3D NAND memory device with floating gate memory cells having a U-shaped structure. Description about FIG. 11 is generally applicable to FIG. 22.

FIG. 22 illustrates bit lines (e.g. 2101-2110) overlying a plurality of stacks of conductive strips including conductive strips 313, 323 and 323 configured as word lines, and a source reference conductor line 1950 overlying a stack of conductive strips including the conductive strip 323. Contact plugs 1711 and 1713 connect vertical channel films on sidewalls of stacks 1601 and 1603 in a first row of vertical channel structures in the row direction (e.g. Y-direction) to bit line 2101. Likewise, contact plugs 1721 and 1723 connect vertical channel films on sidewalls of stacks 1601 and 1603 in a second row of vertical channel structures in the row direction (e.g. Y-direction) to bit line 2102, contact plugs 1731 and 1733 connect vertical channel films on sidewalls of stacks 1601 and 1603 in a second row of vertical channel structures in the row direction (e.g. Y-direction) to bit line 2103, and contact plugs 1741 and 1743 connect vertical channel films on sidewalls of stacks 1601 and 1603 in a second row of vertical channel structures in the row direction (e.g. Y-direction) to bit line 2104.

The contact plugs are illustrated for clarity in FIG. 22, although the contact plugs are disposed beneath the bit lines (e.g. 2101-2104), as shown in FIG. 21. Furthermore the contact plugs (e.g. 1711, 1721, 1731, 1741, 1713, 1723, 1733, 1743, FIG. 17) are disposed on first pads (e.g. 1611, 1621, 1631, 1641, 1613, 1623, 1633, 1643, FIG. 16) respectively, and the first pads can be wide enough to overlie the vertical channel films, the tunnel oxide and the floating gates on sidewalls of the stacks, as shown in FIG. 21.

Figure 23:
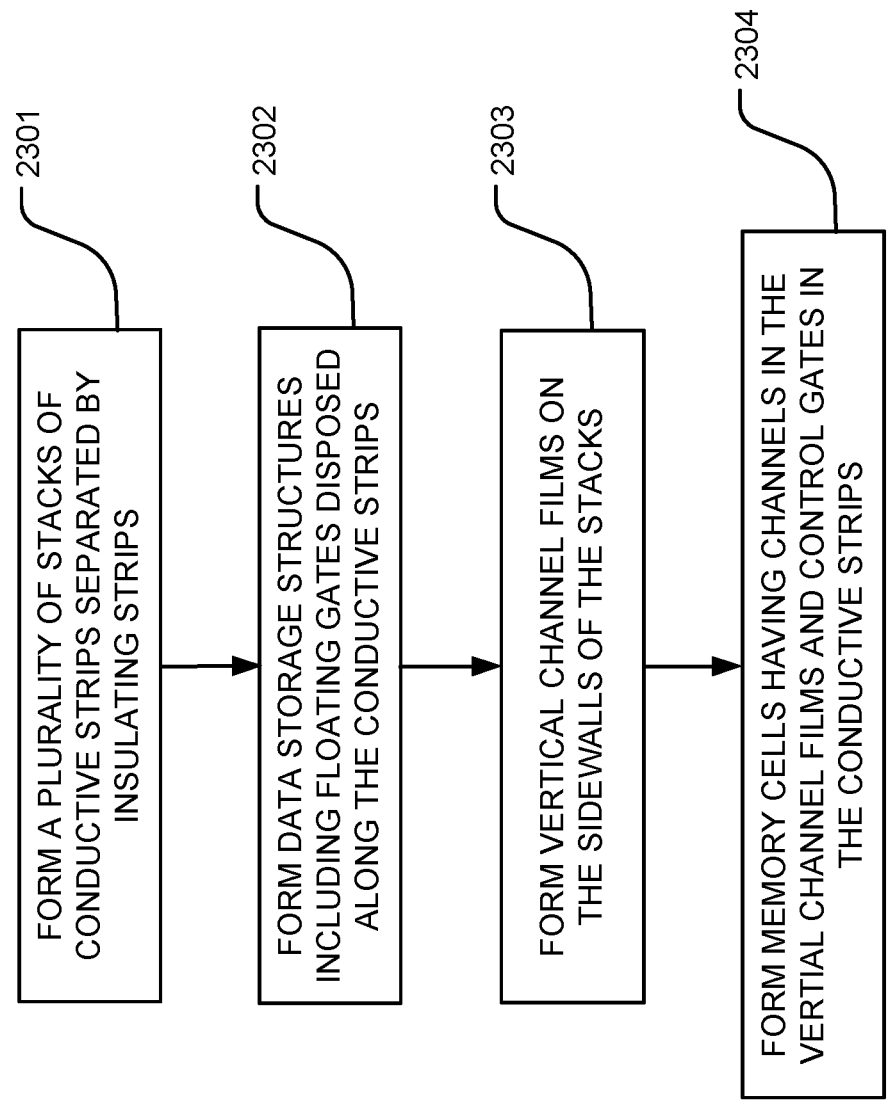
FIG. 23 is a flow chart illustrating a method for manufacturing a SVGC 3D NAND memory device with floating gate memory cells.

FIG. 23 is a flow chart illustrating a method for manufacturing a SVGC 3D NAND memory device with floating gate memory cells. The method includes identifying areas on a substrate for formation of 3D memory blocks having a structure like that of FIG. 1 or FIG. 2. The method includes forming a plurality of layers of conductive material, suitable to act as word lines, separated by layers of insulating material, and etching trenches in the plurality of layers to define a plurality of stacks (e.g. 101, 102, FIG. 1; 201, 202, FIG. 2) of conductive strips (e.g. 321-323, FIG. 1; 2521-2524, FIG. 2) separated by insulating strips (Step 2301). In embodiments, the method includes forming an insulating layer on the substrate by, for example, depositing a layer of silicon dioxide, or other dielectric material or combination of materials on the substrate. Over the insulating layer (e.g. 1600, FIG. 16; 3400, FIG. 34), the method includes forming the plurality of stacks of conductive strips.

The method includes forming data storage structures including floating gates disposed along the conductive strips in the stacks (Step 2302). In one embodiment, the conductive strips are etched to form lateral recesses on sides of the conductive strips, and the floating gates are formed coplanar with conductive strips in the plurality of stacks, where a floating gate in a particular lateral recess is isolated from floating gates in lateral recesses vertically adjacent to the particular lateral recess, as described in connection with FIGS. 3 through 6. In an alternative embodiment, the insulating strips are etched to form lateral recesses on sides of the insulating strips, and the floating gates are formed between the conductive strips in the plurality of stacks in the lateral recesses, where a floating gate in a particular lateral recess is isolated from floating gates in lateral recesses vertically adjacent to the particular lateral recess, as described in connection with FIGS. 25 through 28.

The method includes forming vertical channel films on the sidewalls of the stacks of conductive strips separated by the insulating strips (Step 2303), as described in connection with FIGS. 7 and 29. A solid dielectric material (e.g. 860, FIG. 8; 3060, FIG. 30) can be formed between the vertical channel films on two adjacent stacks in the plurality of stacks. A gap (e.g. 865, FIG. 8; 3065, FIG. 30) can be left between the vertical channel films on two adjacent stacks in the plurality of stacks. The method includes forming memory cells in the plurality of memory cells having channels in the vertical channel films, and control gates in the conductive strips (Step 2304), as described in connection with FIGS. 9 and 31.

In one embodiment, as described in connection with FIGS. 12-15, the vertical channel films are connected to a substrate below the plurality of stacks, and a pair of vertical channel films in the vertical channel films on two adjacent stacks in the plurality of stacks are connected via a pad between the two adjacent stacks at ends distal to the substrate. The method includes forming one or more patterned conductor layers over the plurality of stacks, including a bit line, and interlayer connectors connecting the bit line to the pad.

In an alternative embodiment, as described in connection with FIGS. 16-21, the vertical channel films include first and second vertical channel films on first and second stacks in a pair of adjacent stacks in the plurality of stacks, the first vertical channel film includes a first pad over the first stack on an upper end of the first vertical channel film, the second vertical channel film includes a second pad over the second stack on an upper end of the second vertical channel film, the first and second vertical channel films are connected at ends distal to the pads to form a current path from the first pad over the first stack to the second pad over the second stack. The method includes forming one or more patterned conductor layers over the plurality of stacks, including a bit line and a source line, and interlayer connectors connecting the bit line to the first pad over the first stack and connecting the source line to the second pad over the second stack.

Figure 24:
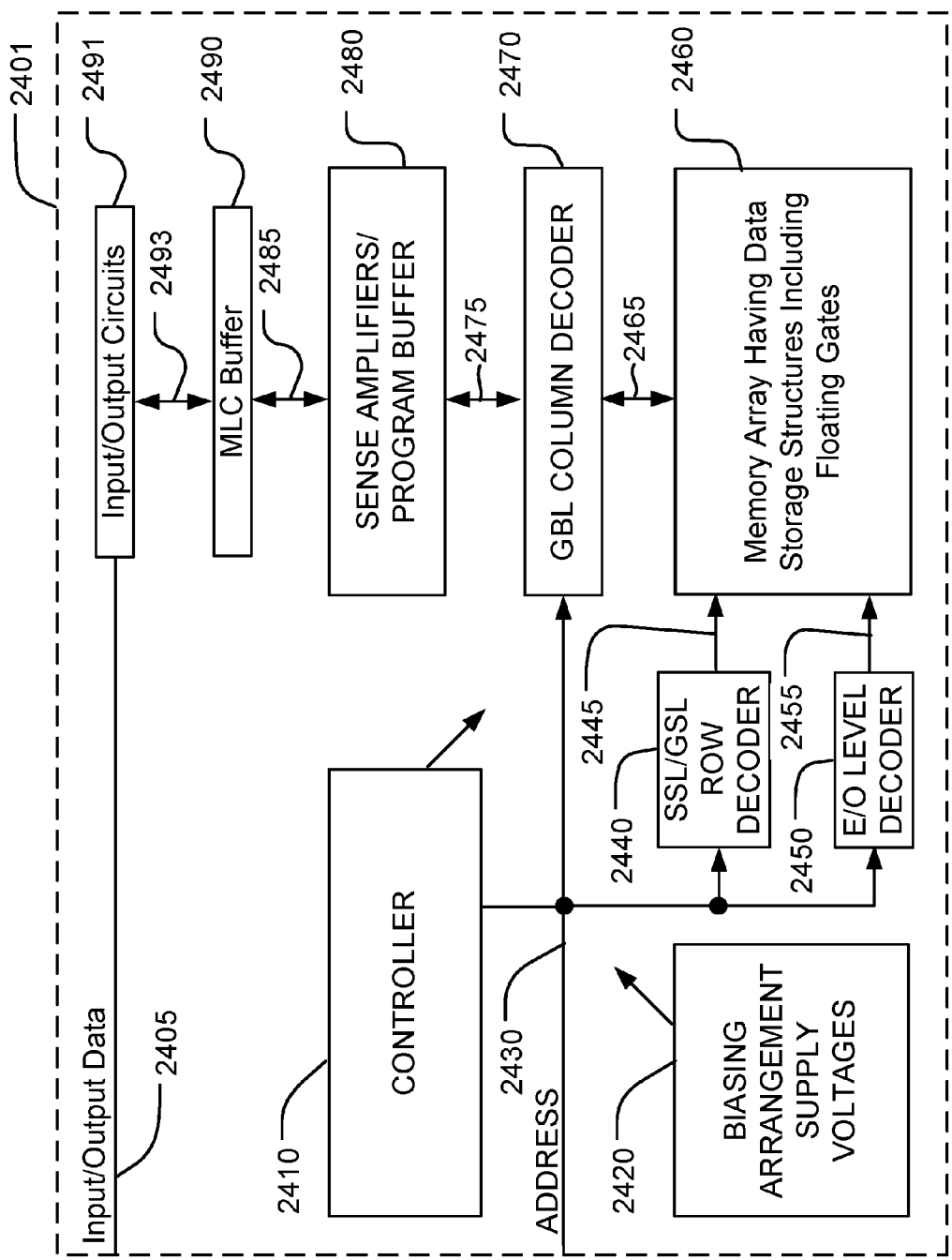
FIG. 24 is a simplified block diagram of an integrated circuit memory including a 3D memory array having data storage structures including floating gates.

FIG. 24 is a simplified block diagram of an integrated circuit memory 2401 including a 3D memory array having data storage structures including floating gates. The integrated circuit memory 2401 includes a memory array 2460, which includes a plurality of stacks of conductive strips separated by insulating strips, and data storage structures including floating gates disposed along the conductive strips in the stacks. The memory 2401 includes vertical channel films on sidewalls of the stacks, and memory cells having channels in the vertical channel films, and control gates in the conductive strips. In one embodiment, the floating gates are coplanar with conductive strips in the plurality of stacks, where the floating gates are disposed between the conductive strips in the plurality of stacks. In an alternative embodiment, the floating gates are disposed between the conductive strips in the plurality of stacks.

An SSL/GSL decoder 2440 is coupled to a plurality of SSL/GSL lines 2445, arranged in the memory array 2460. An even/odd level decoder 2450 is coupled to a plurality of even/odd word lines 2455. A global bit line column decoder 2470 is coupled to a plurality of global bit lines 2465 arranged along columns in the memory array 2460 for reading data from and writing data to the memory array 2460. Addresses are supplied on bus 2430 from control logic 2410 to decoder 2470, decoder 2440 and decoder 2450. Sense amplifier and program buffer circuits 2480 are coupled to the column decoder 2470, in this example via first data lines 2475. The program buffer in circuits 2480 can store program codes for multiple-level programming, or values that are a function of the program codes, to indicate program or inhibit states for selected bit lines. The column decoder 2470 can include circuits for selectively applying program and inhibit voltages to bit lines in the memory in response to the data values in the program buffer.

Sensed data from the sense amplifier/program buffer circuits are supplied via second data lines 2485 to multi-level data buffer 2490, which is in turn coupled to input/output circuits 2491 via a data path 2493. Also, input data is applied in this example to the multi-level data buffer 2490 for use in support of multiple-level program operations for each of the independent sides of the independent double gate cells in the array.

Input/output circuits 2491 drive the data to destinations external to the integrated circuit 2401. Input/output data and control signals are moved via data bus 2405 between the input/output circuits 2491, the control logic 2410 and input/output ports on the integrated circuit 2401 or other data sources internal or external to the integrated circuit 2401, such as a general purpose processor or special purpose application circuitry, or a combination of modules providing system-on-a-chip functionality supported by the memory array 2460.

In the example shown in FIG. 24, control logic 2410, using a bias arrangement state machine, controls the application of supply voltages generated or provided through the voltage supply or supplies in block 2420, such as read, erase, verify and program bias voltages. The control logic 2410 is coupled to the multi-level data buffer 2490 and the memory array 2460. The control logic 2410 includes logic to control multiple-level program operations.

In floating gate memory cells, voltage states represent logic levels, and the accumulated charge on the floating gates in the memory cells as results of electrons moved in and out the floating gates determines the voltage states. To write a logic level of 0 in a floating gate memory cell is commonly referred to as programming, and to write a logic level of 1 in a floating gate memory cell is commonly referred to as erasing.

To program a selected floating gate memory cell, for example, the control logic 2410 applies a word line-side program voltage, such as 10-24V (ISPP stepping pulse), to a word line coupled to the control gate of the selected floating gate memory cell, and a pass voltage of about 10V to unselected floating gate memory cells. To select the floating gate memory cell for programming, the control logic 2410 applies a channel-side program voltage, such as 0V, to the bit line coupled to the selected floating gate memory cell, to move the electrons from the bit line to the floating gate. To inhibit unselected floating gate memory cells while programming the selected floating gate memory cell, the control logic 2410 applies a channel-side inhibit voltage higher than the channel-side program voltage, such as 3.3V, to the bit lines coupled to the unselected floating gate memory cells, to boost the channels in the bit lines to high enough a voltage so that the electrons cannot tunnel through the tunnel oxide from the bit line to the floating gate. During programming, the control logic 2410 applies a turn-on voltage (e.g. 3.3V) to the SSL (string select line) switch coupled to a string of floating gate memory cells including the selected floating gate memory cell, while applying a turn-off bias of either 0V or a slightly negative (−1V) to SSL switches coupled to strings of floating gate memory cells not including the selected floating gate memory cell. During programming, the control logic 2410 applies a turn-off voltage of about 0V or −1V to the GSL (ground select transistor) switch, while raising the source line bias to Vcc (e.g. 3.3V) to provide better inhibit performance.

To erase a selected floating gate memory cell, the control logic 2410 applies a word line-side erase voltage, such as around 0V, to the word line coupled to the control gate of the selected floating gate memory cell, while applying a high positive bias, such as 20V, to the source line, to move the electrons from the floating gate back to the bit line. Bit lines or terminals of unselected floating gate memory cells can be floated.

The control logic 2410 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

Figure 25:
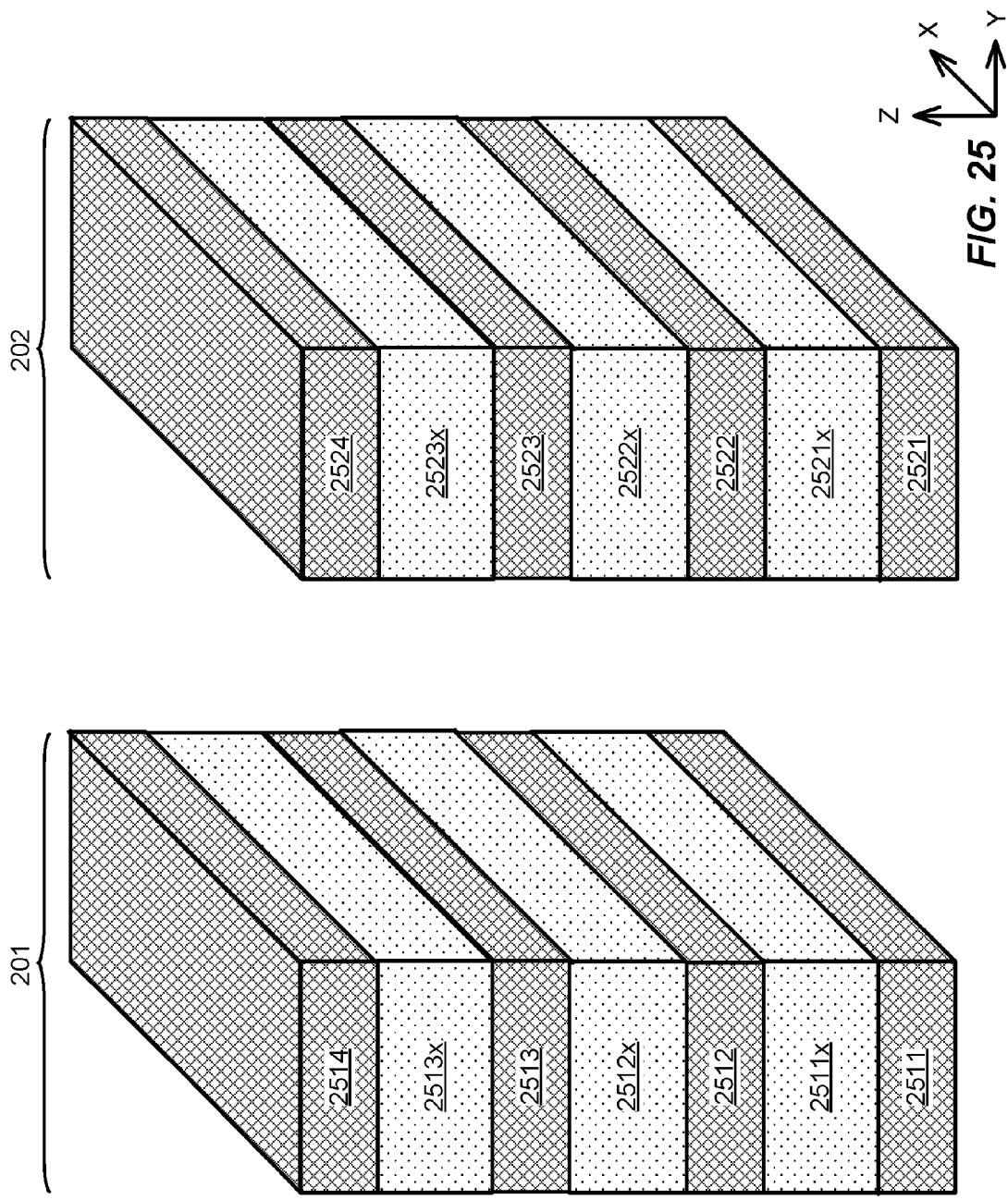

FIGS. 25 through 31 illustrate an example process flow for an alternative embodiment of a SVGC (single gate vertical channel) 3D NAND memory device with floating gate memory cells. FIG. 25 illustrates a stage of the process flow after forming a plurality of stacks of conductive strips separated by insulating strips on a semiconductor substrate (not shown).

To form the structure shown in FIG. 25, a plurality of layers of a first conductive material, such as doped polysilicon, or other material suitable for use as word lines, separated by layers of insulating material, are disposed over the substrate. In embodiments described herein, the layers of conductive material and the layers of insulating material shown in FIG. 25 can be as described for the layers of conductive material and the layers of insulating material shown in FIG. 3. After the plurality of layers is formed, a patterned etch is applied to form a plurality of stacks of conductive strips separated by insulating strips.

FIG. 25 illustrates a stage of the process after etching the plurality of layers to define a plurality of stacks of conductive strips, such as a stack 201 including conductive strips 2511, 2512, 2513 and 2514 separated by insulating strips 2511x, 2512x and 2513x, and a stack 202 including conductive strips 2521, 2522, 2523 and 2524 separated by insulating strips 2521x, 2522x and 2523x. The stacks include at least a plurality of intermediate planes (WLs) of conductive strips configured as word lines (e.g. 2511, 2512, 2513, 2514, 2521, 2522, 2523 and 2524). Although not shown, the stacks can include a top plane of conductive strips configured as string select lines (SSL) and a bottom plane of conductive strips configured as ground select lines (GSL). Alternatively, the memory device can include pairs of a first stack and a second stack, where the first stack can include a top plane of conductive strips configured as string select lines (SSL), the second stack can include a top plane of conductive strips configured as ground select lines (GSL), and a pair of vertical channel films disposed on the first and second stacks in the pair can be connected at ends distal to the string select lines and the ground select lines. The plurality of intermediate planes can include N planes, ranging from 0 to N−1 for the stack. Although not shown, the conductive strips are linked by pads which can be defined in the pattern used for etching the stacks.

Figure 27:
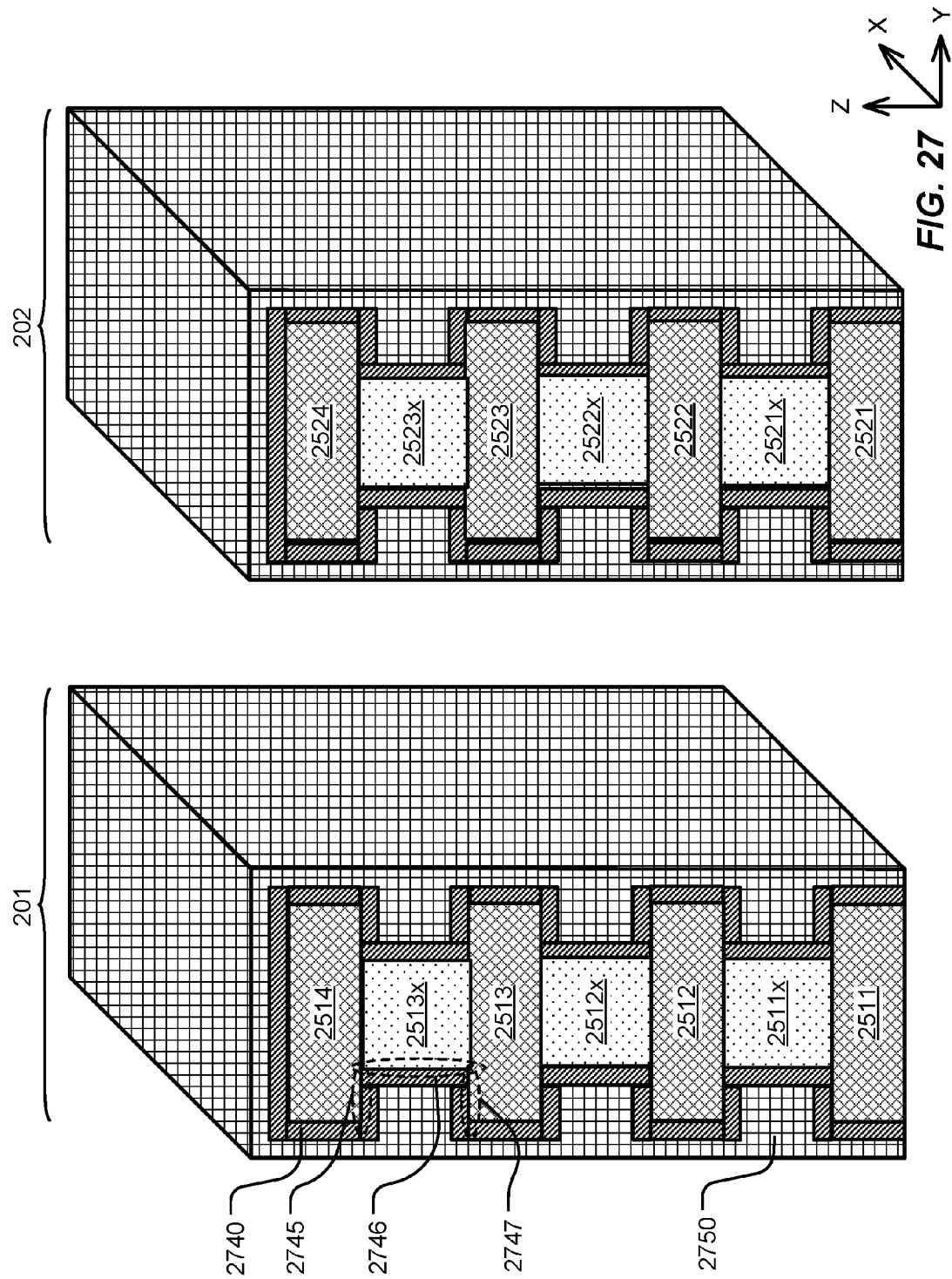
Figure 28:
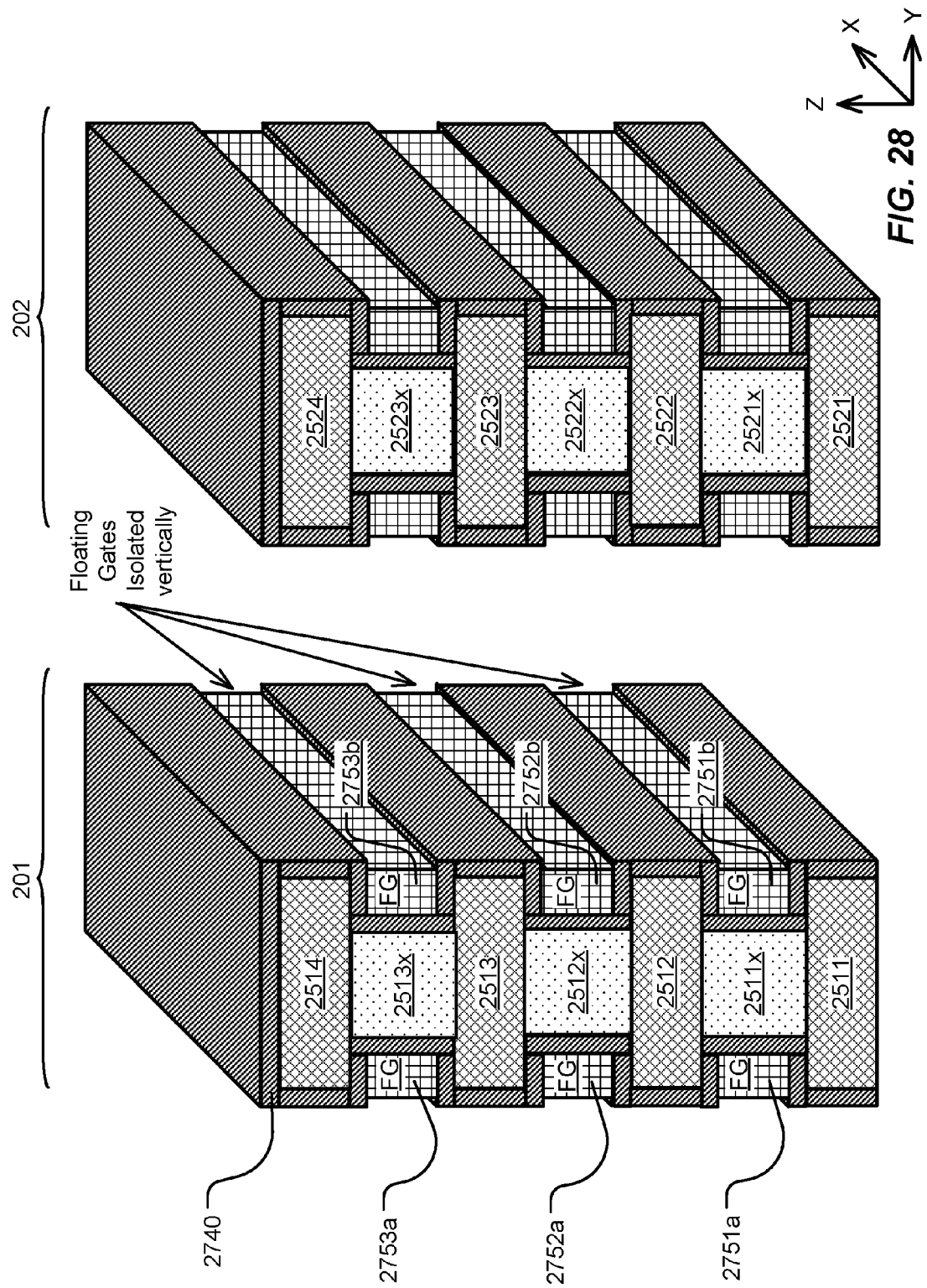

FIGS. 26-28 illustrate forming data storage structures including floating gates disposed along the conductive strips in the stacks in the X-direction. FIG. 26 illustrates a stage of the process flow after etching the insulating strips to form lateral recesses on sides of the insulating strips. For instance, lateral recesses 2511a and 2511b are formed on sides of the insulating strip 2511x, lateral recesses 2512a and 2512b are formed on sides of the insulating strip 2512x, and lateral recesses 2513a and 2513b are formed on sides of the insulating strip 2513x.

FIG. 27 illustrates a stage of the process flow after depositing a layer of inter-gate dielectric material (e.g. 2740) on surfaces of the conductive strips and insulating strips in the lateral recesses (e.g. 2745, 2746, 2747), and a layer of floating gate material (e.g. 2750) over the layer of inter-gate dielectric material in the lateral recesses. The inter-gate dielectric material and the floating gate material are as described in connection with FIG. 1.

FIG. 28 illustrates a stage of the process flow after applying a self-aligned process to isolate the floating gates vertically, without the need for an etch mask. The self-aligned process includes an isotropic poly etch to the structure shown in FIG. 27 to form a floating gate in a particular lateral recess isolated from floating gates in lateral recesses vertically adjacent to the particular lateral recess. For instance, a floating gate 2752b in a particular lateral recess 2512b is isolated from floating gates 2751b and 2753b in lateral recesses 2511b and 2513b vertically adjacent to the particular lateral recess 312b.

The floating gates (e.g. 2752a, 2752b) thus formed are along the conductive strips (e.g. 2512 and 2513) in the stacks in the X-direction, and between the conductive strips (e.g. 2512 and 2513) in the stacks in the Z-direction. Likewise, the floating gates (e.g. 2751a, 2751b) thus formed are along the conductive strips (e.g. 2511 and 2512) in the stacks in the X-direction, and between the conductive strips (e.g. 2511 and 2512) in the stacks in the Z-direction. The floating gates (e.g. 2753a, 2753b) thus formed are along the conductive strips (e.g. 2513 and 2514) in the stacks in the X-direction, and between the conductive strips (e.g. 2513 and 2514) in the stacks in the Z-direction.

FIG. 29 illustrates a stage of the process flow after forming vertical channel films on sidewalls of the stacks in the plurality of stacks. To form the structure shown in FIG. 29, a tunnel oxide layer (e.g. 2945) is deposited on sidewalls of the stacks in the plurality of stacks, including on sidewalls of the floating gates in the lateral recesses in the plurality of stacks of conductive strips. The tunnel oxide layer (e.g. 2945) can include a conventional tunnel oxide such as silicon dioxide (SiO2), a barrier engineered tunnel oxide, or a bandgap engineered tunnel oxide.

A thin-film semiconductor layer (e.g. 2950) is then deposited over and on the tunnel oxide layer (e.g. 2945). The semiconductor material in the thin-film semiconductor layer 2950 includes a semiconductor adapted by choice of material, e.g. silicon, and doping concentrations (e.g. undoped or lightly doped) to act as channel regions for vertical strings of memory cells, at least in the regions between the stacks. The thin-film semiconductor layer 2950 can have a thickness of about 10 nanometers or less. The thin-film semiconductor layer (e.g. 2950) can be a thin polysilicon film, or semiconductor materials such as SiGe, SiC, etc.

Figure 30:
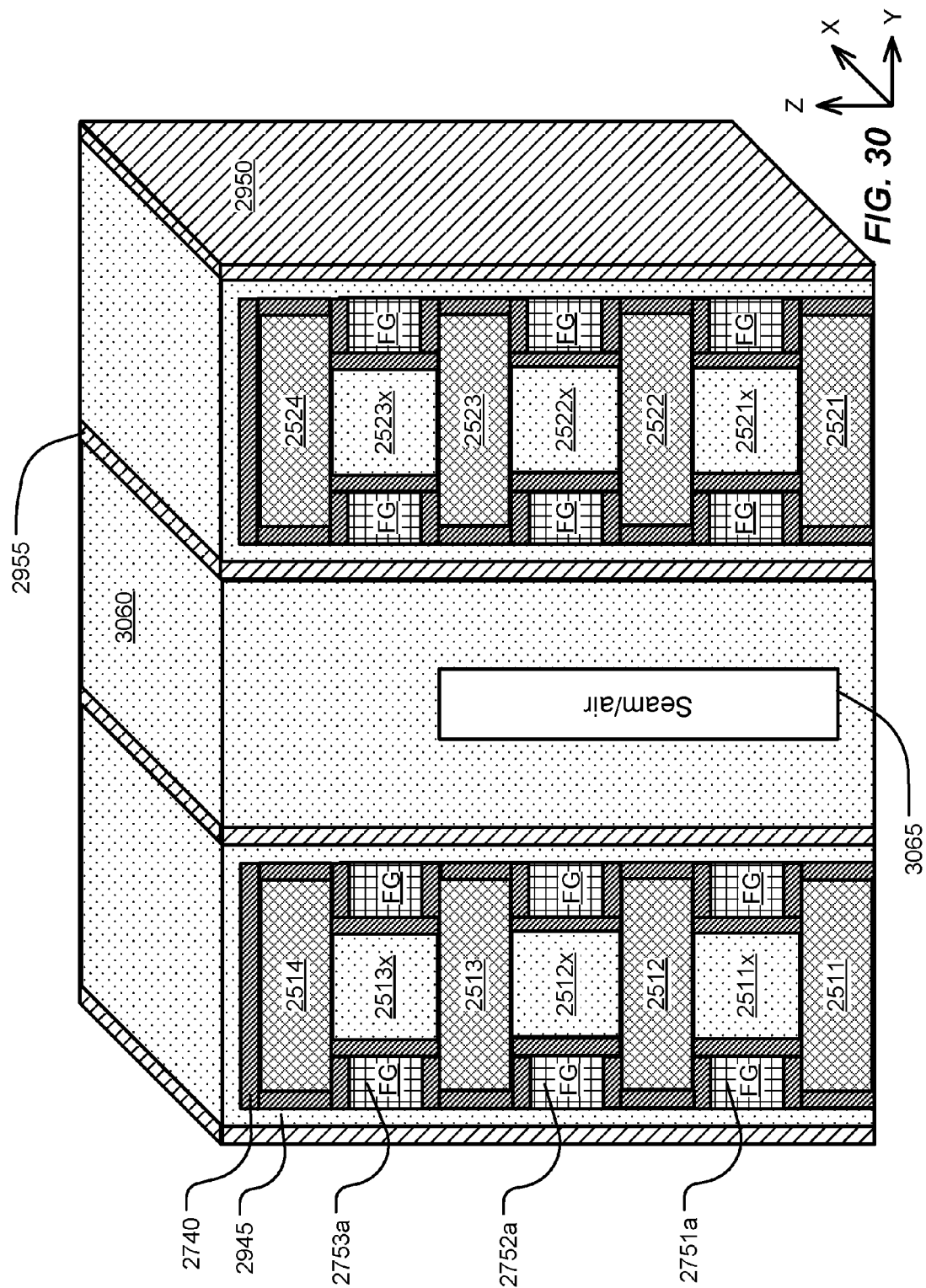

FIG. 30 illustrates a stage in the process flow after performing a step to fill between stacks on the inside surfaces of the thin-film semiconductor layer (e.g. 2950) with an insulating fill (e.g. 3060) such as silicon dioxide, leaving an air gap (e.g. 865) at least in regions adjacent the intermediate layers of conductive strips. After the fill step, an etch back or planarizing step such as chemical mechanical polishing can be applied to expose the top surface (e.g. 2955) of the thin-film semiconductor layer (e.g. 2950).

Figure 31:
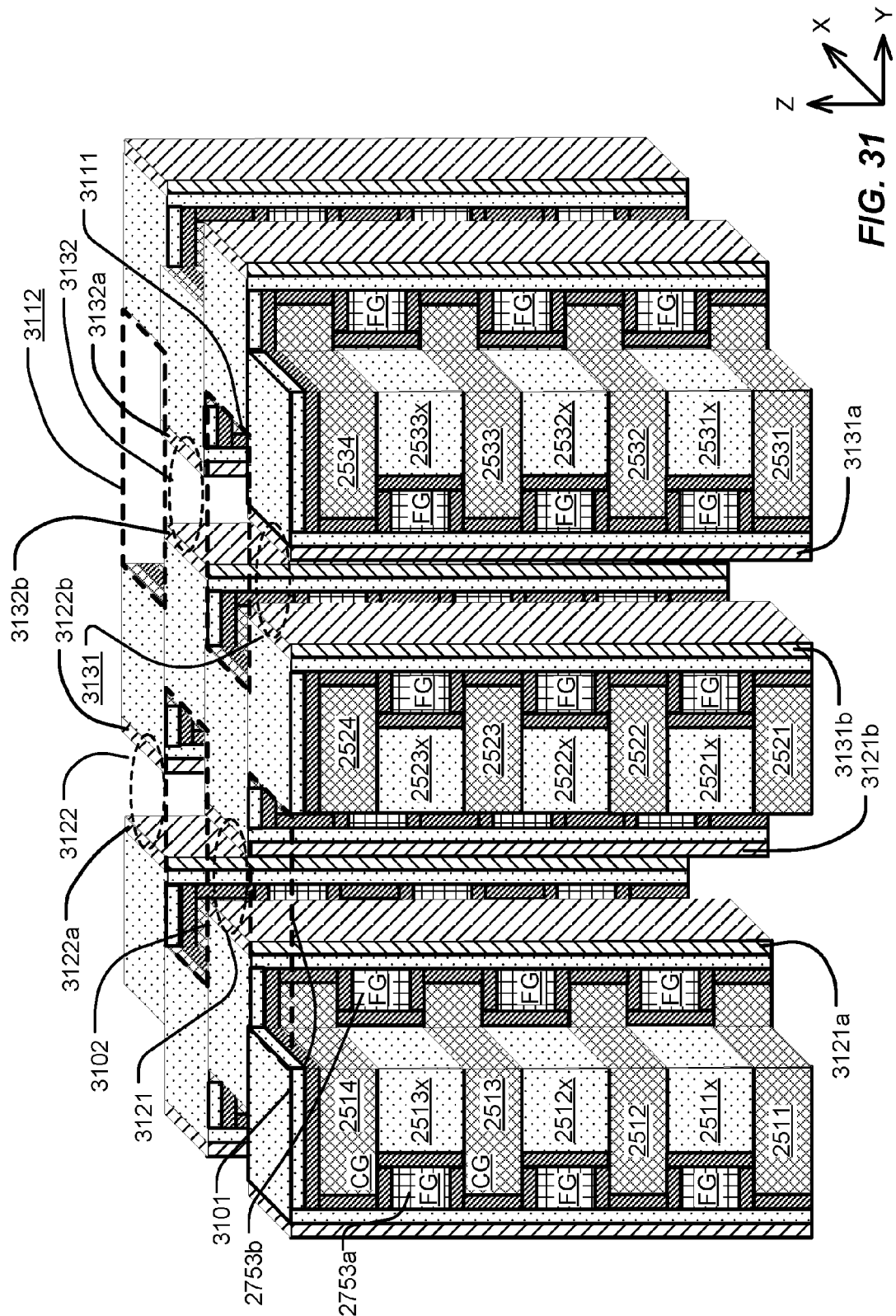

FIG. 31 illustrates a stage in the process flow after etching the vertical channel films and the data storage structures to define a plurality of memory cells having channels in the vertical channel films, and control gates in the conductive strips. The structure includes a plurality of stacks of conductive strips, such as a first stack including conductive strips 2511, 2512, 2513 and 2514 separated by insulating strips 2511x, 2512x and 2513x, a second stack including conductive strips 2521, 2522, 2523 and 2524 separated by insulating strips 2521x, 2522x and 2523x, and a third stack including conductive strips 2531, 2532, 2533 and 2534 separated by insulating strips 2531x, 2532x and 2533x. To form the structure shown in FIG. 31, a bit line cut etch is applied, which includes etching holes (e.g. 3101, 3102, 3111, 3112) between the stacks through the thin-film semiconductor layer (e.g. 2950, FIG. 30) and data storage structures including the floating gates (FG). The bit line cut etch is a non-selective etch that can etch both the oxide layers and the polysilicon layers.

As a result of the holes (e.g. 3101, 3102, 3111, 3112), a plurality of vertical channel structures (e.g. 3121, 3122, 3131, 3132) is formed. A vertical channel structure in the plurality of vertical channel structures includes vertical channel films on adjacent stacks with the insulating fill (e.g. 3060, FIG. 30) between the vertical channel films in the vertical channel structure. For instance, vertical channel structures 3121, 3122, 3131 and 3132 include vertical channel films 3121a and 3121b, 3122a and 3122b, 3131a and 3131b, and 3132a and 3132b, respectively. As illustrated in FIG. 31, the vertical channel structures (e.g. 3121, 3122, 3131, 3132) are laid out in a honeycomb arrangement, so that each row of vertical channel structures is offset in the row direction (e.g. Y-direction) from adjacent rows of vertical channel structures. This honeycomb arrangement facilitates formation of overlying bit lines with a tighter pitch. Insulating fill is applied in the holes between the vertical channel structures to form insulating structures (e.g. 3201, 3202, 3203, 3211, 3212, 3213, FIG. 32).

Figure 32:
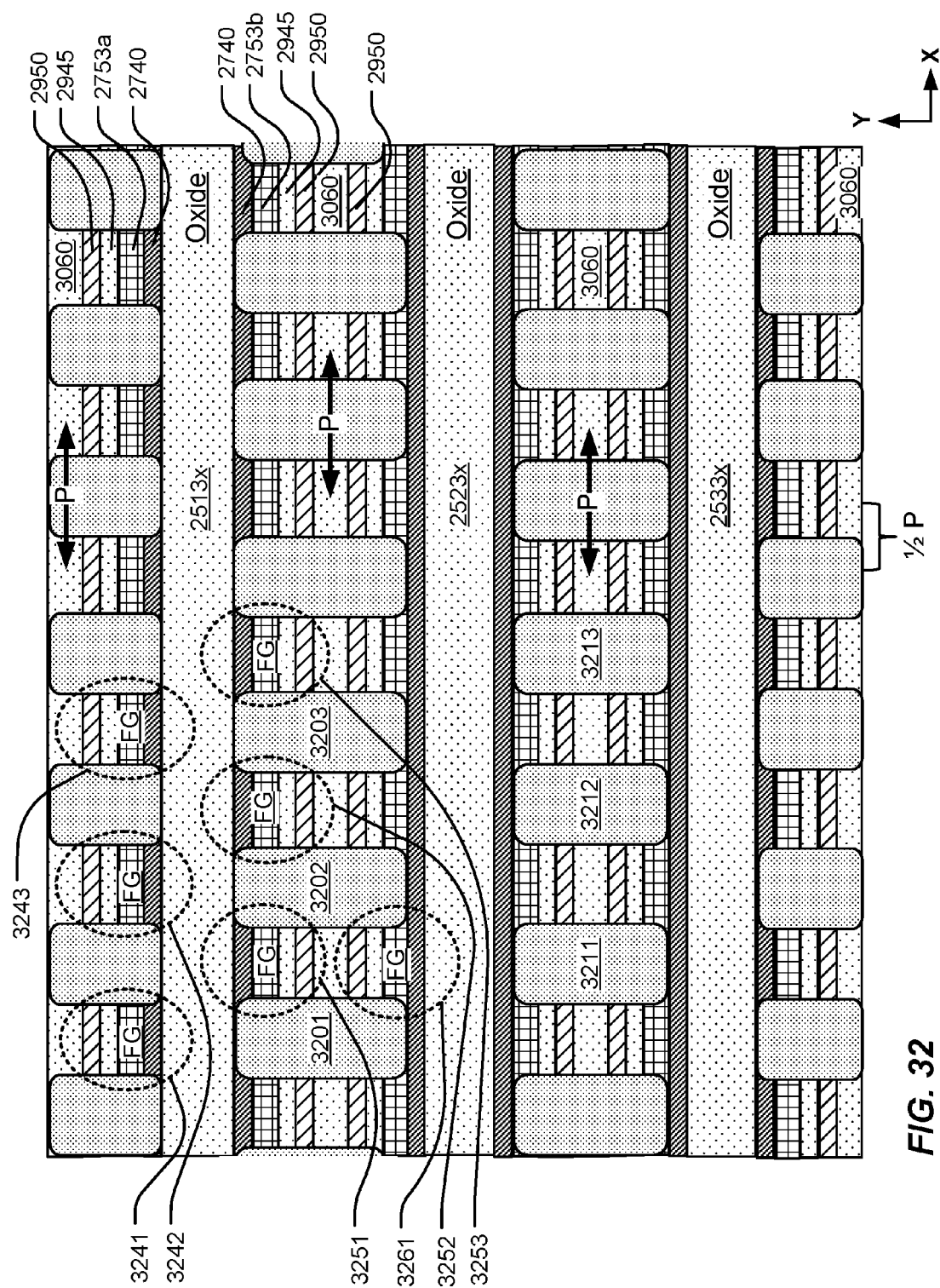
FIG. 32 illustrates in layout view an alternative embodiment for a SVGC 3D NAND memory device with floating gate memory cells having a bottom source structure.

FIG. 32 illustrates in layout view an alternative embodiment for a SVGC 3D NAND memory device with floating gate memory cells having a bottom source structure. FIG. 32 is a cross-section taken in the X-Y plane through an insulating layer including insulating strips that separate conductive strips configured as word lines (WL) in stacks of conductive strips in the 3D block. The cross-section through an insulating layer in the block illustrates a layout view with an insulating fill between the vertical channel structures providing insulating structures (e.g. 3201, 3202, 3203, 3211, 3212, 3213) isolating the channels of adjacent cells along the conductive strips in the stacks, which are aligned in the same direction, e.g. the X-direction, as the insulating strips. In the layout, the insulating strips 2513x, 2523x and 2533x are illustrated. Each of the insulating strips is disposed in a separate stack of conductive strips separated by insulating strips.

Memory cells (e.g. 3241, 3242, 3243) in the plurality of memory cells having control gates CG in a particular conductive strip (e.g. 2514) in the stacks of conductive strips have floating gates FG (e.g. 2753a, FIGS. 28 and 31) on a first side of the particular conductive strip (e.g. 2514), and adjacent memory cells (e.g. 3251, 3252, 3253) in the plurality of memory cells having control gates CG in the particular conductive strip (e.g. 2514) have floating gates FG (e.g. 2753b, FIGS. 28 and 31) on a second side of the particular conductive strip (e.g. 2514) opposite the first side. The particular conductive strip 2514 is disposed above the insulating strip 2513x as shown in FIG. 31. The memory cells (e.g. 3241, 3242, 3243) are in rows of memory cells in a row direction (e.g. Y-direction), while adjacent memory cells (e.g. 3251, 3252, 3253) are in adjacent rows of memory cells in the row direction. For instance, a memory cell 3242 is in a row of memory cells in the row direction, while adjacent memory cells 3251 and 3252 are in adjacent rows of memory cells in the row direction. Another memory cell 3243 is in a row of memory cells in the row direction, while adjacent memory cells 3252 and 3253 are in adjacent rows of memory cells in the row direction.

A layer of inter-gate dielectric material (e.g. 2740) is disposed between the insulating strips (e.g. 2513x) and the floating gates FG (e.g. 2753a and 2753b) as shown in FIG. 32, and also disposed between the conductive strips (e.g. 2514 and 2513) above and below the floating gates FG (e.g. 2753a and 2753b) as shown in FIG. 28. A tunnel oxide layer (e.g. 2945) is disposed between the floating gates FG (e.g. 2753a and 2753b) and the thin-film semiconductor layer 2950. The insulating fill (e.g. 3060) within a vertical channel structure separates the memory cells between adjacent stacks (e.g. 3251 and 3261), where the memory cell 3251 includes the thin-film semiconductor layer disposed on the sidewall of a stack of conductive strips including the conductive strip 2513x, and the memory cell 3261 includes the thin-film semiconductor layer disposed on the sidewall of an adjacent stack of conductive strips including the conductive strip 2523x.

The memory cells along a first side of a conductive strip (e.g. cells 3241, 3242, 3243) are arranged with a uniform pitch P in the X direction along the first side of the conductive strip 2513x. Also, the cells along a second side of the same conductive strip opposite the first side (e.g. cells 3251, 3252, 3253) are arranged with a uniform pitch P in the X direction along the second side of the conductive strip 2513x. In this embodiment, the cells on the first side of the conductive strip are offset in the X direction by one half of the uniform pitch (½ P) from the cells on the second side of the conductive strip. This results in a twisted layout allowing a tighter pitch for overlying bit lines. The length of the pitch P is selected to meet manufacturing requirements for the formation of the stacks of conductive strips, and the structures on the sidewalls of the stacks as described above. In some examples, the pitch can be on the order of 50 to 100 nm.

Figure 33:
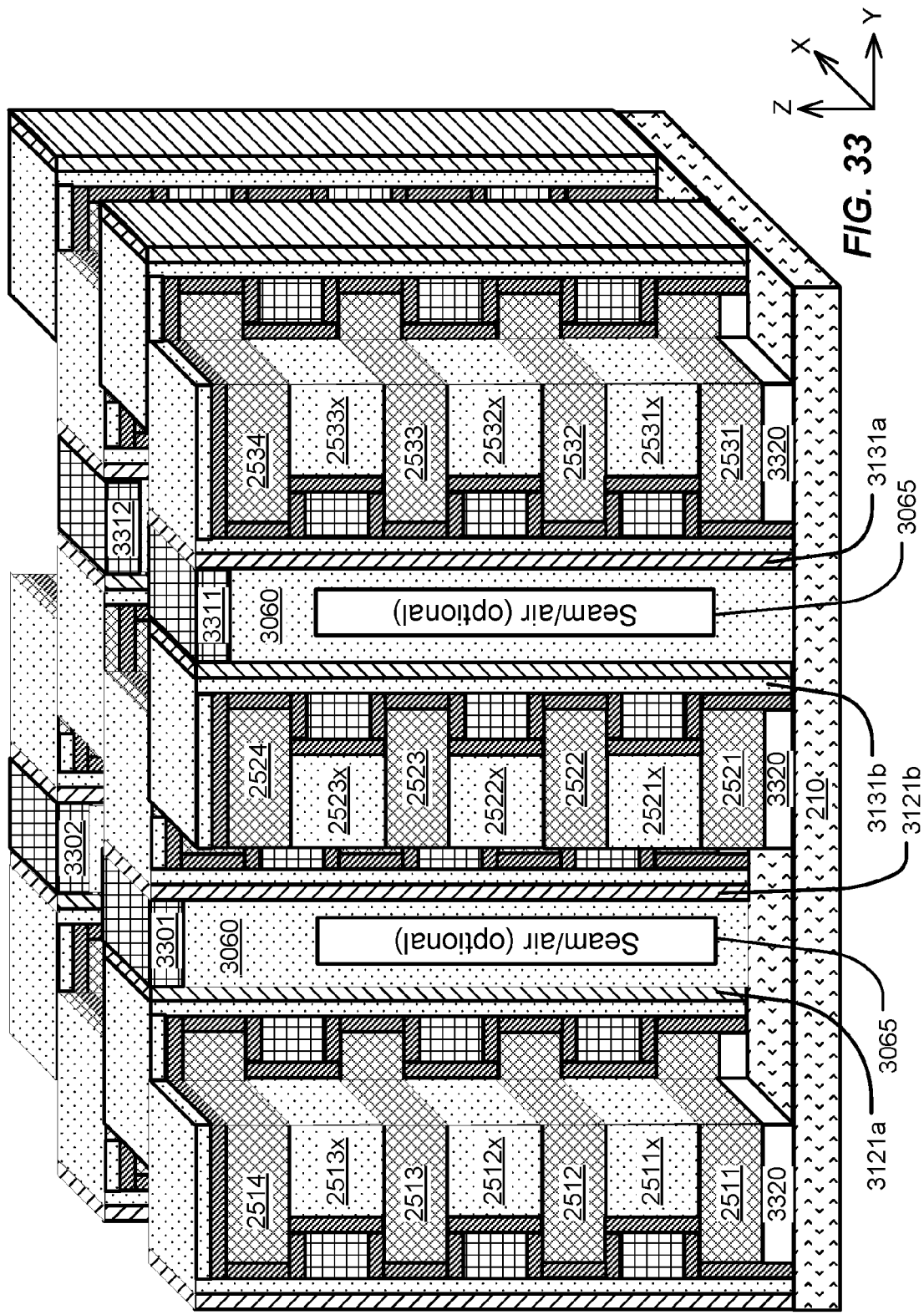
FIG. 33 illustrates in perspective view an alternative embodiment for a SVGC 3D NAND memory device with floating gate memory cells having a bottom source structure.

FIG. 33 illustrates in perspective view an alternative embodiment for a SVGC 3D NAND memory device with floating gate memory cells having a bottom source structure. FIG. 33 illustrates the structure after a stage in the process flow that includes formation of pads (e.g. 3301, 3302, 3311, 3312) between two adjacent stacks at ends of the vertical channel films (e.g. 3121a, 3121b, 3131a, 3131b) distal to a substrate (e.g. 210), where the vertical channel films are connected to the substrate below the plurality of stacks, and a pair of vertical channel films in the vertical channel films on two adjacent stacks in the plurality of stacks are connected via the pad. A layer of nitride material (e.g. 3320) disposed between a bottom layer of conductive strips in the stacks of conductive strips and the substrate 210 is preferred to prevent recess of the channel at the substrate.

The stage in the process flow can include formation of an array of contact plugs (not shown in FIG. 33) landing on corresponding pads (e.g. 3301, 3302, 3311, 3312). Description about an array of contact plugs (e.g. 1251, 1252, 1253, 1254, FIG. 12) for the first-described embodiment having a bottom source structure, where the floating gates are coplanar with the conductive strips in the lateral recesses on sides of the conductive strips, is generally applicable to the alternative embodiment having the bottom source structure as shown in FIG. 33, where the floating gates are between the conductive strips in the plurality of stacks in the lateral recesses on sides of the insulating strips.

Likewise, description about interlayer connectors (e.g. 1261, 1262, 1263, 1264, FIG. 13) on the contact plugs (e.g. 1251, 1252, 1253, 1254), posts (e.g. 1271, 1272, 1273, 1274, FIG. 13) in contact with the interlayer connectors (e.g. 1261, 1262, 1263, 1264), and the interlayer connectors (e.g. 1281, 1282, 1283, 1284) for making connection of the NAND strings to overlying patterned conductors via the posts (e.g. 1271, 1272, 1273, 1274, FIG. 14) is generally applicable to the alternative embodiment having the bottom source structure as shown in FIG. 33. Furthermore, description about the second patterned conductor layer including bit lines (e.g. 1501, 1502, 1503 and 1504, FIG. 15) and their connections to the pads is generally applicable to the alternative embodiment having the bottom source structure as shown in FIG. 33.

Figure 34:
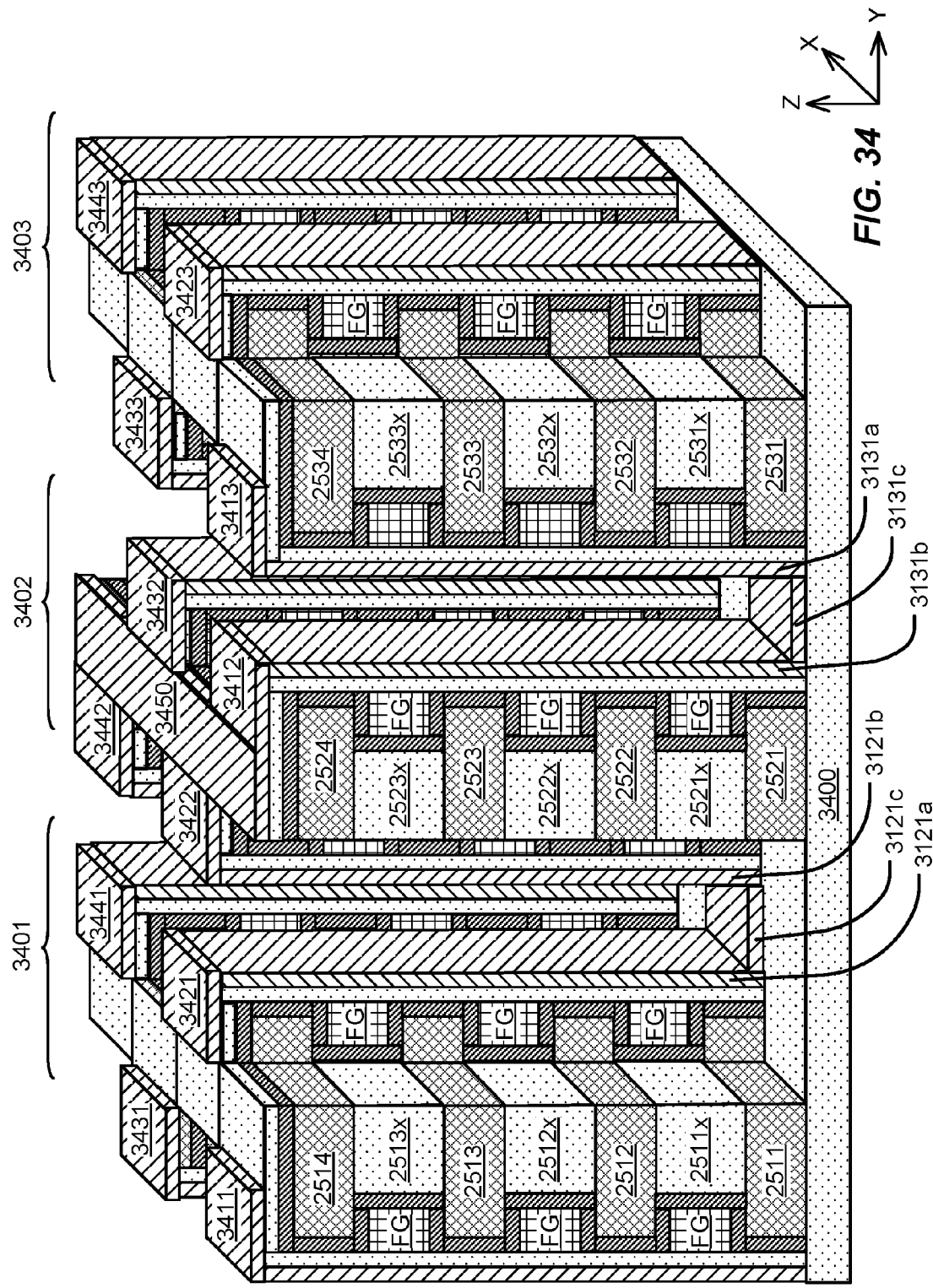
FIG. 34 illustrates in perspective view an alternative embodiment for a SVGC 3D NAND memory device with floating gate memory cells having a U-shaped structure.

FIG. 34 illustrates in perspective view an alternative embodiment for a SVGC 3D NAND memory device with floating gate memory cells having a U-shaped structure. FIG. 34 illustrates the structure after stages in the process flow that include formation of a first pad over a first stack and a second pad over a second stack in a pair of adjacent stacks, where first and second vertical channel films on sidewalls of the first and second stacks are connected at ends distal to the first and second pads. The plurality of stacks of conductive strips including the pair of adjacent stacks is disposed on an insulating layer 3400 which can comprise a silicon oxide or other dielectric on a semiconductor substrate.

FIG. 34 shows the structure after doing a patterned etch to divide the thin-film semiconductor layer 2950 (FIGS. 29-30) over the stacks for the purposes of forming array connections. After the patterned etch, the thin-film semiconductor layer 2950 is divided into first vertical channel films (e.g. 3121a, 3131a) disposed on first stacks (e.g. 3401, 3403), first pads (e.g. 3411, 3421, 3431, 3441, 3413, 3423, 3433, 3443) for connecting the first vertical channel films to the bit lines, second vertical channel films (e.g. 3121b, 3131b) disposed on second stacks (e.g. 3402), and second pads (e.g. 3412, 3422, 3432, 3442) for connecting the second vertical channel films to the source line via a portion (e.g. 3450) of the thin-film semiconductor layer 2950. The first pads and second pads can be wide enough to overlie the vertical channel films, the tunnel oxide and the floating gates on sidewalls of the stacks. Although not shown in FIG. 34, the first stacks (e.g. 3401, 3403) can include a top plane of conductive strips configured as string select lines (SSL), and the second stacks (e.g. 3402) can include a top plane of conductive strips configured as ground select lines (GSL).

As shown in the example of FIG. 34, a vertical channel structure in a row of vertical channel structures includes first and second vertical channel films 3131a and 3131b on first and second stacks 3403 and 3402 in a pair of adjacent stacks in the plurality of stacks. The first vertical channel film 3131a includes a first pad (e.g. 3413) over the first stack 3403 on an upper end of the first vertical channel film 3131a, and the second vertical channel film 3131b includes a second pad (e.g. 3412) over the second stack 3402 on an upper end of the second vertical channel film 3131b. The first and second vertical channel films 3131a and 3131b are connected at ends (e.g. 3131c) distal to the first and second pads to form a current path from the first pad 3413 over the first stack to the second pad 3412 over the second stack.

Likewise, a vertical channel structure in an adjacent row of vertical channel structures includes first and second vertical channel films 3121a and 3121b on first and second stacks 3401 and 3402 in a pair of adjacent stacks in the plurality of stacks. The first vertical channel film 3121a includes a first pad (e.g. 3421) over the first stack 3401 on an upper end of the first vertical channel film 3121a, and the second vertical channel film 3121b includes a second pad (e.g. 3422) over the second stack 3402 on an upper end of the second vertical channel film 3121b. The first and second vertical channel films 3121a and 3121b are connected at ends (e.g. 3121c) distal to the first and second pads to form a current path from the first pad 3421 over the first stack to the second pad 3422 over the second stack.

The process flow can include formation of one or more patterned conductor layers over the plurality of stacks, including a bit line and a source line, and interlayer connectors connecting the bit line to the first pad over the first stack and connecting the source line to the second pad over the second stack (not shown in FIG. 34). Description about such formation for the first-described embodiment having the U-shaped structure in connection with FIGS. 17-21, where the floating gates are coplanar with the conductive strips in the plurality of stacks in the lateral recesses on sides of the conductive strips, is generally applicable to the alternative embodiment having the U-shaped structure as shown in FIG. 34, where the floating gates are between the conductive strips in the plurality of stacks in the lateral recesses on sides of the insulating strips.

Figure 35:
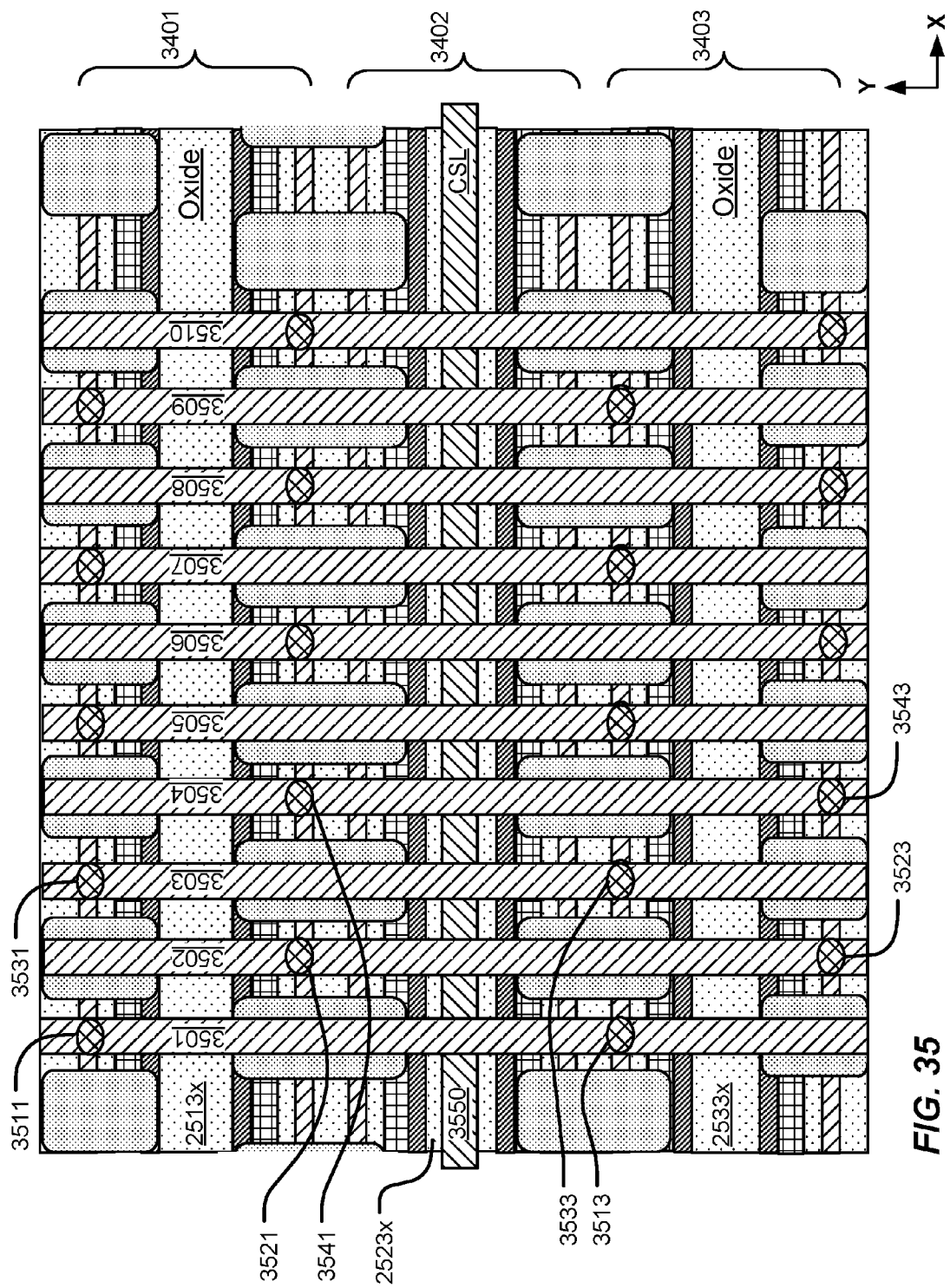
FIG. 35 illustrates in layout view an alternative embodiment for a SVGC 3D NAND memory device with floating gate memory cells having a U-shaped structure.

FIG. 35 illustrates in layout view an alternative embodiment for a SVGC 3D NAND memory device with floating gate memory cells having a U-shaped structure. Description about FIG. 32 is generally applicable to FIG. 35.

FIG. 35 illustrates bit lines (e.g. 3501-3510) overlying insulating strips 2513x, 2523x and 2533x that separate conductive strips (e.g. 2513 and 2514, 2523 and 2524, 2533 and 2534, FIG. 34), and a source reference conductor line CSL 3550 overlying a stack of conductive strips separated by insulating strips including the insulating strip 2523x. Contact plugs 3511 and 3513 connect vertical channel films on sidewalls of stacks 3401 and 3403 in a first row of vertical channel structures in the row direction (e.g. Y-direction) to bit line 3501. Likewise, contact plugs 3521 and 3523 connect vertical channel films on sidewalls of stacks 3401 and 3403 in a second row of vertical channel structures in the row direction (e.g. Y-direction) to bit line 3502, contact plugs 3531 and 3533 connect vertical channel films on sidewalls of stacks 3401 and 3403 in a second row of vertical channel structures in the row direction (e.g. Y-direction) to bit line 3503, and contact plugs 3541 and 3543 connect vertical channel films on sidewalls of stacks 3401 and 3403 in a second row of vertical channel structures in the row direction (e.g. Y-direction) to bit line 3504.

The contact plugs are illustrated for clarity in FIG. 35, although the contact plugs are disposed beneath the bit lines (e.g. 3501-3510). Furthermore the contact plugs (e.g. 3511, 3521, 3531, 3541, 3513, 3523, 3533, 3543, FIG. 35) are disposed on first pads (e.g. 3411, 3421, 3431, 3441, 3413, 3423, 3433, 3443, FIG. 34) respectively, and the first pads can be wide enough to overlie the vertical channel films, the tunnel oxide and the floating gates on sidewalls of the stacks, as shown in FIG. 34.

While the present technology is disclosed by reference to the preferred embodiments and examples detailed herein, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A manufacturing method, comprising:
   forming a plurality of stacks of conductive strips separated by insulating strips, including first and second stacks of conductive strips;
   after said forming the plurality of stacks, forming data storage structures including floating gates disposed along the conductive strips in the first and second stacks;
   after said forming the data storage structures, depositing first and second vertical channel films having outside surfaces disposed on the data storage structures on sidewalls of the first and second stacks; and
   after said depositing the first and second vertical channel films, etching the first and second vertical channel films and the data storage structures to define first and second memory cells having channels in the first and second vertical channel films, and control gates in the conductive strips in the first and second stacks.

2. The method of claim 1, said forming data storage structures comprising:
   etching the conductive strips to form lateral recesses on sides of the conductive strips; and
   forming the floating gates coplanar with the conductive strips in the plurality of stacks in the lateral recesses.

3. The method of claim 2, wherein a floating gate in a particular lateral recess is isolated from floating gates in lateral recesses vertically adjacent to the particular lateral recess.

4. The method of claim 1, said forming data storage structures comprising:
   etching the insulating strips to form lateral recesses on sides of the insulating strips; and
   forming the floating gates between the conductive strips in the plurality of stacks in the lateral recesses.

5. The method of claim 4, wherein a floating gate in a particular lateral recess is isolated from floating gates in lateral recesses vertically adjacent to the particular lateral recess.

6. The method of claim 1,
   wherein memory cells in the first memory cells having control gates in a particular conductive strip in the stacks of conductive strips have floating gates on a first side of the particular conductive strip, and adjacent memory cells in the plurality of memory cells having control gates in the particular conductive strip have floating gates on a second side of the particular conductive strip opposite the first side.

7. The method of claim 1, wherein the first and second vertical channel films are connected to a substrate below the plurality of stacks, and a pair of vertical channel films in the first and second vertical channel films on two adjacent stacks in the plurality of stacks are connected via a pad between the two adjacent stacks at ends distal to the substrate, comprising:
   forming one or more patterned conductor layers over the plurality of stacks, including a bit line, and interlayer connectors connecting the bit line to the pad.

8. The method of claim 1, wherein the first vertical channel film includes a first pad over the first stack on an upper end of the first vertical channel film, the second vertical channel film includes a second pad over the second stack on an upper end of the second vertical channel film, the first and second vertical channel films are connected at ends distal to the first and second pads to form a current path from the first pad over the first stack to the second pad over the second stack, comprising:

forming one or more patterned conductor layers over the plurality of stacks, including a bit line and a source line, and interlayer connectors connecting the bit line to the first pad over the first stack and connecting the source line to the second pad over the second stack.

9. The method of claim 1, wherein forming the plurality of stacks includes:

forming a plurality of layers of conductive material separated by layers of insulating material; and etching trenches in the plurality of layers to define the plurality of stacks.

10. The method of claim 1, comprising leaving a gap between the vertical channel films on two adjacent stacks in the plurality of stacks.

\* \* \* \* \*